（12） United States Patent
Kumar

(10) Patent No.: US 11,023,377 B2
(45) Date of Patent: Jun. 1, 2021

(54) APPLICATION MAPPING ON HARDENED NETWORK-ON-CHIP (NOC) OF FIELD-PROGRAMMABLE GATE ARRAY (FPGA)

(71) Applicant: NetSpeed Systems, Inc., San Jose, CA (US)

(72) Inventor: Sailesh Kumar, San Jose, CA (US)

(73) Assignee: NetSpeed Systems, Inc., San Jose, CA (US)

( * ) Notice: Subject to any disclaimer, the term of this patent is extended or adjusted under 35 U.S.C. 154(b) by 106 days.

(21) Appl. No.: 16/258,366

(22) Filed: Jan. 25, 2019

(65) Prior Publication Data
US 2019/0266089 A1    Aug. 29, 2019

Related U.S. Application Data

(60) Provisional application No. 62/634,587, filed on Feb. 23, 2018.

(51) Int. Cl.
*G06F 12/0813* (2016.01)
*G06F 30/331* (2020.01)
(Continued)

(52) U.S. Cl.
CPC ........ *G06F 12/0813* (2013.01); *G06F 9/3838* (2013.01); *G06F 12/0811* (2013.01);
(Continued)

(58) Field of Classification Search
CPC ............. G06F 12/0811; G06F 12/0813; G06F 9/3838; G06F 15/7825; G06F 17/5027;
(Continued)

(56) References Cited

U.S. PATENT DOCUMENTS 4,409,838 A   10/1983   Schomberg
4,933,933 A    6/1990   Dally et al.
(Continued)

FOREIGN PATENT DOCUMENTS

CN   103684961 A   3/2014
JP     5936793     5/2016
(Continued)

OTHER PUBLICATIONS

Ababei, C., et al., Achieving Network on Chip Fault Tolerance by Adaptive Remapping, Parallel & Distributed Processing, 2009, IEEE International Symposium, 4 pgs.
(Continued)

*Primary Examiner* — Vuthe Siek
(74) *Attorney, Agent, or Firm* — Spectrum IP Law Group LLC

(57) ABSTRACT

Methods and example implementations described herein are generally directed to the addition of networks-on-chip (NoC) to FPGAs to customize traffic and optimize performance. An aspect of the present application relates to a Field-Programmable Gate-Array (FPGA) system. The FPGA system can include an FPGA having one or more lookup tables (LUTs) and wires, and a Network-on-Chip (NoC) having a hardened network topology configured to provide connectivity at a higher frequency that the FPGA. The NoC is coupled to the FPGA to receive an profile information associated with an application, retrieve at least a characteristic, selected form any of combination of any or combination of a bandwidth requirement, latency requirement, protocol requirement and transactions, associated with the application from the profile information, generate at least one application traffic graph having mapping information based on the characteristic retrieved, and map the applica-
(Continued)

tion traffic graph generated with into the FPGA using the hardened NoC.

20 Claims, 13 Drawing Sheets

(51) Int. Cl.
  *G06F 12/0811* (2016.01)
  *G06F 9/38* (2018.01)
  *H04L 12/773* (2013.01)
  *H04L 12/725* (2013.01)
  *H04L 12/713* (2013.01)

(52) U.S. Cl.
  CPC .......... *G06F 30/331* (2020.01); *H04L 45/302* (2013.01); *H04L 45/586* (2013.01); *H04L 45/60* (2013.01)

(58) Field of Classification Search
  CPC ........ G06F 30/331; G06F 30/34; G06F 15/78; G06F 9/38; H04L 45/302; H04L 45/586; H04L 45/60; H04L 12/773; H04L 12/725; H04L 12/713; H04L 45/10
  See application file for complete search history.

(56) References Cited

U.S. PATENT DOCUMENTS

| | | | |
|---|---|---|---|
| 5,105,424 A | 4/1992 | Flaig et al. |
| 5,163,016 A | 11/1992 | Har'El et al. |
| 5,355,455 A | 10/1994 | Hilgendorf et al. |
| 5,432,785 A | 7/1995 | Ahmed et al. |
| 5,563,003 A | 10/1996 | Suzuki et al. |
| 5,583,990 A | 12/1996 | Birrittella et al. |
| 5,588,152 A | 12/1996 | Dapp et al. |
| 5,764,740 A | 6/1998 | Holender |
| 5,790,554 A | 8/1998 | Pitcher et al. |
| 5,859,981 A | 1/1999 | Levin et al. |
| 5,991,308 A | 11/1999 | Fuhrmann et al. |
| 5,999,530 A | 12/1999 | LeMaire et al. |
| 6,003,029 A | 12/1999 | Agrawal et al. |
| 6,029,220 A | 2/2000 | Iwamura et al. |
| 6,058,385 A | 5/2000 | Koza et al. |
| 6,101,181 A | 8/2000 | Passint et al. |
| 6,108,739 A | 8/2000 | James et al. |
| 6,249,902 B1 | 6/2001 | Igusa et al. |
| 6,314,487 B1 | 11/2001 | Hahn et al. |
| 6,377,543 B1 | 4/2002 | Grover et al. |
| 6,415,282 B1 | 7/2002 | Mukherjea et al. |
| 6,674,720 B1 | 1/2004 | Passint et al. |
| 6,701,361 B1 | 3/2004 | Meier |
| 6,711,717 B2 | 3/2004 | Nystrom et al. |
| 6,778,531 B1 | 8/2004 | Kodialam et al. |
| 6,925,627 B1 | 8/2005 | Longway et al. |
| 6,967,926 B1 | 11/2005 | Williams, Jr. et al. |
| 6,983,461 B2 | 1/2006 | Hutchison et al. |
| 7,046,633 B2 | 5/2006 | Carvey |
| 7,065,730 B2 | 6/2006 | Alpert et al. |
| 7,143,221 B2 | 11/2006 | Bruce et al. |
| 7,318,214 B1 | 1/2008 | Prasad et al. |
| 7,379,424 B1 | 5/2008 | Krueger |
| 7,437,518 B2 | 10/2008 | Tsien |
| 7,461,236 B1 | 12/2008 | Wentzlaff |
| 7,509,619 B1 | 3/2009 | Miller et al. |
| 7,564,865 B2 | 7/2009 | Radulescu |
| 7,583,602 B2 | 9/2009 | Bejerano et al. |
| 7,590,959 B2 | 9/2009 | Tanaka |
| 7,693,064 B2 | 4/2010 | Thubert et al. |
| 7,701,252 B1 | 4/2010 | Chow et al. |
| 7,724,735 B2 | 5/2010 | Locatelli et al. |
| 7,725,859 B1 | 5/2010 | Lenahan et al. |
| 7,774,783 B2 | 8/2010 | Toader |
| 7,808,968 B1 | 10/2010 | Kalmanek, Jr. et al. |
| 7,853,774 B1 | 12/2010 | Wentzlaff |
| 7,917,885 B2 | 3/2011 | Becker |
| 7,957,381 B2 | 6/2011 | Clermidy et al. |
| 7,973,804 B2 | 7/2011 | Mejdrich et al. |
| 8,018,249 B2 | 9/2011 | Koch et al. |
| 8,020,163 B2 | 9/2011 | Nollet et al. |
| 8,020,168 B2 | 9/2011 | Hoover et al. |
| 8,050,256 B1 | 11/2011 | Bao et al. |
| 8,059,551 B2 | 11/2011 | Milliken |
| 8,098,677 B1 | 1/2012 | Pleshek et al. |
| 8,099,757 B2 | 1/2012 | Riedle et al. |
| 8,136,071 B2 | 3/2012 | Solomon |
| 8,203,938 B2 | 6/2012 | Gibbings |
| 8,261,025 B2 | 9/2012 | Mejdrich et al. |
| 8,281,297 B2 | 10/2012 | Dasu et al. |
| 8,306,042 B1 | 11/2012 | Abts |
| 8,312,402 B1 | 11/2012 | Okhmatovski et al. |
| 8,352,774 B2 | 1/2013 | Elrabaa |
| 8,407,425 B2 | 3/2013 | Gueron et al. |
| 8,412,795 B2 | 4/2013 | Mangano et al. |
| 8,438,578 B2 | 5/2013 | Hoover et al. |
| 8,448,102 B2 | 5/2013 | Kornachuk et al. |
| 8,490,110 B2 | 7/2013 | Hoover et al. |
| 8,492,886 B2 | 7/2013 | Or-Bach et al. |
| 8,503,445 B2 | 8/2013 | Lo |
| 8,514,889 B2 | 8/2013 | Jayasimha |
| 8,541,819 B1 | 9/2013 | Or-Bach et al. |
| 8,543,964 B2 | 9/2013 | Ge et al. |
| 8,572,353 B1 | 10/2013 | Bratt et al. |
| 8,601,423 B1 | 12/2013 | Philip et al. |
| 8,614,955 B2 | 12/2013 | Gintis et al. |
| 8,619,622 B2 | 12/2013 | Harrand et al. |
| 8,635,577 B2 | 1/2014 | Kazda et al. |
| 8,661,455 B2 | 2/2014 | Mejdrich et al. |
| 8,667,439 B1 | 3/2014 | Kumar et al. |
| 8,705,368 B1 | 4/2014 | Abts et al. |
| 8,711,867 B2 | 4/2014 | Guo et al. |
| 8,717,875 B2 | 5/2014 | Bejerano et al. |
| 8,726,295 B2 | 5/2014 | Hoover et al. |
| 8,738,860 B1 | 5/2014 | Griffin et al. |
| 8,793,644 B2 | 7/2014 | Michel et al. |
| 8,798,038 B2 | 8/2014 | Jayasimha et al. |
| 8,819,611 B2 | 8/2014 | Philip et al. |
| 8,885,510 B2 | 11/2014 | Kumar et al. |
| 9,210,048 B1 | 12/2015 | Marr et al. |
| 9,223,711 B2 | 12/2015 | Philip et al. |
| 9,244,845 B2 | 1/2016 | Rowlands et al. |
| 9,244,880 B2 | 1/2016 | Philip et al. |
| 9,253,085 B2 | 2/2016 | Kumar et al. |
| 9,294,354 B2 | 3/2016 | Kumar |
| 9,319,232 B2 | 4/2016 | Kumar |
| 9,444,702 B1 | 9/2016 | Raponi et al. |
| 9,471,726 B2 | 10/2016 | Kumar et al. |
| 9,473,359 B2 | 10/2016 | Kumar et al. |
| 9,473,388 B2 | 10/2016 | Kumar et al. |
| 9,473,415 B2 | 10/2016 | Kumar |
| 9,477,280 B1 | 10/2016 | Gangwar et al. |
| 9,529,400 B1 | 12/2016 | Kumar et al. |
| 9,535,848 B2 | 1/2017 | Rowlands et al. |
| 9,568,970 B1 | 2/2017 | Kaushal et al. |
| 9,569,579 B1 | 2/2017 | Kumar |
| 9,571,341 B1 | 2/2017 | Kumar et al. |
| 9,571,402 B2 | 2/2017 | Kumar et al. |
| 9,571,420 B2 | 2/2017 | Kumar |
| 9,590,813 B1 | 3/2017 | Kumar et al. |
| 9,660,942 B2 | 5/2017 | Kumar |
| 9,699,079 B2 | 7/2017 | Chopra et al. |
| 9,742,630 B2 | 8/2017 | Philip et al. |
| 2002/0071392 A1 | 6/2002 | Grover et al. |
| 2002/0073380 A1 | 6/2002 | Cooke et al. |
| 2002/0083159 A1 | 6/2002 | Ward et al. |
| 2002/0095430 A1 | 7/2002 | Egilsson et al. |
| 2002/0150094 A1 | 10/2002 | Cheng et al. |
| 2003/0005149 A1 | 1/2003 | Haas et al. |
| 2003/0088602 A1 | 5/2003 | Dutta et al. |
| 2003/0145314 A1 | 7/2003 | Nguyen et al. |
| 2003/0200315 A1 | 10/2003 | Goldenberg et al. |
| 2004/0006584 A1 | 1/2004 | Vandeweerd |
| 2004/0019814 A1 | 1/2004 | Pappalardo et al. |
| 2004/0049565 A1 | 3/2004 | Keller et al. |

(56) References Cited

U.S. PATENT DOCUMENTS

| | | |
|---|---|---|
| 2004/0103218 A1 | 5/2004 | Blumrich et al. |
| 2004/0156376 A1 | 8/2004 | Nakagawa |
| 2004/0156383 A1 | 8/2004 | Nakagawa et al. |
| 2004/0216072 A1 | 10/2004 | Alpert et al. |
| 2005/0147081 A1 | 7/2005 | Acharya et al. |
| 2005/0203988 A1 | 9/2005 | Nollet et al. |
| 2005/0228930 A1 | 10/2005 | Ning et al. |
| 2005/0286543 A1 | 12/2005 | Coppola et al. |
| 2006/0002303 A1 | 1/2006 | Bejerano et al. |
| 2006/0031615 A1 | 2/2006 | Bruce et al. |
| 2006/0053312 A1 | 3/2006 | Jones et al. |
| 2006/0075169 A1 | 4/2006 | Harris et al. |
| 2006/0104274 A1 | 5/2006 | Caviglia et al. |
| 2006/0161875 A1 | 7/2006 | Rhee |
| 2006/0206297 A1 | 9/2006 | Ishiyama et al. |
| 2006/0209846 A1 | 9/2006 | Clermidy et al. |
| 2006/0268909 A1 | 11/2006 | Langevin et al. |
| 2007/0038987 A1 | 2/2007 | Ohara et al. |
| 2007/0088537 A1 | 4/2007 | Lertora et al. |
| 2007/0118320 A1 | 5/2007 | Luo et al. |
| 2007/0147379 A1 | 6/2007 | Lee et al. |
| 2007/0162903 A1 | 7/2007 | Babb, II et al. |
| 2007/0189283 A1 | 8/2007 | Agarwal et al. |
| 2007/0244676 A1 | 10/2007 | Shang et al. |
| 2007/0256044 A1 | 11/2007 | Coryer et al. |
| 2007/0267680 A1 | 11/2007 | Uchino et al. |
| 2007/0274331 A1 | 11/2007 | Locatelli et al. |
| 2008/0072182 A1 | 3/2008 | He et al. |
| 2008/0120129 A1 | 5/2008 | Seubert et al. |
| 2008/0126569 A1 | 5/2008 | Rhim et al. |
| 2008/0127014 A1 | 5/2008 | Pandey et al. |
| 2008/0184259 A1 | 7/2008 | Lesartre et al. |
| 2008/0186998 A1 | 8/2008 | Rijpkema |
| 2008/0211538 A1 | 9/2008 | Lajolo et al. |
| 2008/0232387 A1 | 9/2008 | Rijpkema et al. |
| 2009/0037888 A1 | 2/2009 | Tatsuoka et al. |
| 2009/0046727 A1 | 2/2009 | Towles |
| 2009/0067331 A1 | 3/2009 | Watsen et al. |
| 2009/0067348 A1 | 3/2009 | Vasseur et al. |
| 2009/0070726 A1 | 3/2009 | Mehrotra et al. |
| 2009/0083263 A1 | 3/2009 | Felch et al. |
| 2009/0089725 A1 | 4/2009 | Khan |
| 2009/0109996 A1 | 4/2009 | Hoover et al. |
| 2009/0122703 A1 | 5/2009 | Gangwal et al. |
| 2009/0125574 A1 | 5/2009 | Mejdrich et al. |
| 2009/0125703 A1 | 5/2009 | Mejdrich et al. |
| 2009/0125706 A1 | 5/2009 | Hoover et al. |
| 2009/0135739 A1 | 5/2009 | Hoover et al. |
| 2009/0138567 A1 | 5/2009 | Hoover et al. |
| 2009/0150647 A1 | 6/2009 | Mejdrich et al. |
| 2009/0157976 A1 | 6/2009 | Comparan et al. |
| 2009/0172304 A1 | 7/2009 | Gueron et al. |
| 2009/0182944 A1 | 7/2009 | Comparan et al. |
| 2009/0182954 A1 | 7/2009 | Mejdrich et al. |
| 2009/0182986 A1 | 7/2009 | Schwinn et al. |
| 2009/0182987 A1 | 7/2009 | Mejdrich et al. |
| 2009/0187716 A1 | 7/2009 | Comparan et al. |
| 2009/0187734 A1 | 7/2009 | Mejdrich et al. |
| 2009/0187756 A1 | 7/2009 | Nollet et al. |
| 2009/0201302 A1 | 8/2009 | Hoover et al. |
| 2009/0210184 A1 | 8/2009 | Medardoni et al. |
| 2009/0210883 A1 | 8/2009 | Hoover et al. |
| 2009/0228681 A1 | 9/2009 | Mejdrich et al. |
| 2009/0228682 A1 | 9/2009 | Mejdrich et al. |
| 2009/0228689 A1 | 9/2009 | Muff et al. |
| 2009/0228690 A1 | 9/2009 | Muff et al. |
| 2009/0231348 A1 | 9/2009 | Mejdrich et al. |
| 2009/0231349 A1 | 9/2009 | Mejdrich et al. |
| 2009/0240920 A1 | 9/2009 | Muff et al. |
| 2009/0245257 A1 | 10/2009 | Comparan et al. |
| 2009/0256836 A1 | 10/2009 | Fowler et al. |
| 2009/0260013 A1 | 10/2009 | Heil et al. |
| 2009/0268677 A1 | 10/2009 | Chou et al. |
| 2009/0271172 A1 | 10/2009 | Mejdrich et al. |
| 2009/0276572 A1 | 11/2009 | Heil et al. |
| 2009/0282139 A1 | 11/2009 | Mejdrich et al. |
| 2009/0282197 A1 | 11/2009 | Comparan et al. |
| 2009/0282211 A1 | 11/2009 | Hoover et al. |
| 2009/0282214 A1 | 11/2009 | Kuesel et al. |
| 2009/0282221 A1 | 11/2009 | Heil et al. |
| 2009/0282222 A1 | 11/2009 | Hoover et al. |
| 2009/0282226 A1 | 11/2009 | Hoover et al. |
| 2009/0282227 A1 | 11/2009 | Hoover et al. |
| 2009/0282419 A1 | 11/2009 | Mejdrich et al. |
| 2009/0285222 A1 | 11/2009 | Hoover et al. |
| 2009/0287885 A1 | 11/2009 | Kriegel et al. |
| 2009/0292907 A1 | 11/2009 | Schwinn et al. |
| 2009/0293061 A1 | 11/2009 | Schwinn et al. |
| 2009/0300292 A1 | 12/2009 | Fang |
| 2009/0300335 A1 | 12/2009 | Muff et al. |
| 2009/0307714 A1 | 12/2009 | Hoover et al. |
| 2009/0313592 A1 | 12/2009 | Murali et al. |
| 2009/0315908 A1 | 12/2009 | Comparan et al. |
| 2010/0023568 A1 | 1/2010 | Hickey et al. |
| 2010/0031009 A1 | 2/2010 | Muff et al. |
| 2010/0040162 A1 | 2/2010 | Suehiro |
| 2010/0042812 A1 | 2/2010 | Hickey et al. |
| 2010/0042813 A1 | 2/2010 | Hickey et al. |
| 2010/0070714 A1 | 3/2010 | Hoover et al. |
| 2010/0091787 A1 | 4/2010 | Muff et al. |
| 2010/0100707 A1 | 4/2010 | Mejdrich et al. |
| 2010/0100712 A1 | 4/2010 | Mejdrich et al. |
| 2010/0100770 A1 | 4/2010 | Mejdrich et al. |
| 2010/0100934 A1 | 4/2010 | Mejdrich et al. |
| 2010/0106940 A1 | 4/2010 | Muff et al. |
| 2010/0125722 A1 | 5/2010 | Hickey et al. |
| 2010/0158005 A1 | 6/2010 | Mukhopadhyay et al. |
| 2010/0162019 A1 | 6/2010 | Kumar et al. |
| 2010/0189111 A1 | 7/2010 | Muff et al. |
| 2010/0191940 A1 | 7/2010 | Mejdrich et al. |
| 2010/0211718 A1 | 8/2010 | Gratz et al. |
| 2010/0223505 A1 | 9/2010 | Andreev et al. |
| 2010/0228781 A1 | 9/2010 | Fowler et al. |
| 2010/0239185 A1 | 9/2010 | Fowler et al. |
| 2010/0239186 A1 | 9/2010 | Fowler et al. |
| 2010/0242003 A1 | 9/2010 | Kwok |
| 2010/0269123 A1 | 10/2010 | Mejdrich et al. |
| 2010/0284309 A1 | 11/2010 | Allan et al. |
| 2010/0333099 A1 | 12/2010 | Kupferschmidt et al. |
| 2011/0022754 A1 | 1/2011 | Cidon et al. |
| 2011/0035523 A1 | 2/2011 | Feero et al. |
| 2011/0044336 A1 | 2/2011 | Umeshima |
| 2011/0060831 A1 | 3/2011 | Ishii et al. |
| 2011/0063285 A1 | 3/2011 | Hoover et al. |
| 2011/0064077 A1 | 3/2011 | Wen |
| 2011/0072407 A1 | 3/2011 | Keinert et al. |
| 2011/0085550 A1 | 4/2011 | Lecler et al. |
| 2011/0085561 A1 | 4/2011 | Ahn et al. |
| 2011/0103799 A1 | 5/2011 | Shacham et al. |
| 2011/0119322 A1 | 5/2011 | Li et al. |
| 2011/0154282 A1 | 6/2011 | Chang et al. |
| 2011/0173258 A1 | 7/2011 | Arimilli et al. |
| 2011/0191088 A1 | 8/2011 | Hsu et al. |
| 2011/0191774 A1 | 8/2011 | Hsu et al. |
| 2011/0235531 A1 | 9/2011 | Vangal et al. |
| 2011/0243147 A1 | 10/2011 | Paul |
| 2011/0276937 A1 | 11/2011 | Waller |
| 2011/0289485 A1 | 11/2011 | Mejdrich et al. |
| 2011/0292063 A1 | 12/2011 | Mejdrich et al. |
| 2011/0302345 A1 | 12/2011 | Boucard et al. |
| 2011/0302450 A1 | 12/2011 | Hickey et al. |
| 2011/0307734 A1 | 12/2011 | Boesen et al. |
| 2011/0316864 A1 | 12/2011 | Mejdrich et al. |
| 2011/0320719 A1 | 12/2011 | Mejdrich et al. |
| 2011/0320724 A1 | 12/2011 | Mejdrich et al. |
| 2011/0320771 A1 | 12/2011 | Mejdrich et al. |
| 2011/0320854 A1 | 12/2011 | Elrabaa |
| 2011/0320991 A1 | 12/2011 | Hsu et al. |
| 2011/0321057 A1 | 12/2011 | Mejdrich et al. |
| 2012/0022841 A1 | 1/2012 | Appleyard |
| 2012/0023473 A1 | 1/2012 | Brown et al. |
| 2012/0026917 A1 | 2/2012 | Guo et al. |
| 2012/0054511 A1 | 3/2012 | Brinks et al. |
| 2012/0072635 A1 | 3/2012 | Yoshida et al. |

(56) References Cited

U.S. PATENT DOCUMENTS

| | | |
|---|---|---|
| 2012/0079147 A1 | 3/2012 | Ishii et al. |
| 2012/0099475 A1 | 4/2012 | Tokuoka |
| 2012/0110106 A1 | 5/2012 | De Lescure et al. |
| 2012/0110541 A1 | 5/2012 | Ge et al. |
| 2012/0144065 A1 | 6/2012 | Parker et al. |
| 2012/0155250 A1 | 6/2012 | Carney et al. |
| 2012/0173846 A1 | 7/2012 | Wang et al. |
| 2012/0176364 A1 | 7/2012 | Schardt et al. |
| 2012/0195321 A1 | 8/2012 | Ramanujam et al. |
| 2012/0198408 A1 | 8/2012 | Chopra |
| 2012/0209944 A1 | 8/2012 | Mejdrich et al. |
| 2012/0218998 A1 | 8/2012 | Sarikaya |
| 2012/0221711 A1 | 8/2012 | Kuesel et al. |
| 2012/0260252 A1 | 10/2012 | Kuesel et al. |
| 2012/0311512 A1 | 12/2012 | Michel et al. |
| 2013/0021896 A1 | 1/2013 | Pu et al. |
| 2013/0028083 A1 | 1/2013 | Yoshida et al. |
| 2013/0028090 A1 | 1/2013 | Yamaguchi et al. |
| 2013/0028261 A1 | 1/2013 | Lee |
| 2013/0036296 A1 | 2/2013 | Hickey et al. |
| 2013/0044117 A1 | 2/2013 | Mejdrich et al. |
| 2013/0046518 A1 | 2/2013 | Mejdrich et al. |
| 2013/0051397 A1 | 2/2013 | Guo et al. |
| 2013/0054811 A1 | 2/2013 | Harrand |
| 2013/0073771 A1 | 3/2013 | Hanyu et al. |
| 2013/0073878 A1 | 3/2013 | Jayasimha et al. |
| 2013/0080073 A1 | 3/2013 | de Corral |
| 2013/0080671 A1 | 3/2013 | Ishii et al. |
| 2013/0086399 A1 | 4/2013 | Tychon et al. |
| 2013/0103369 A1 | 4/2013 | Huynh et al. |
| 2013/0103912 A1 | 4/2013 | Jones et al. |
| 2013/0111190 A1 | 5/2013 | Muff et al. |
| 2013/0111242 A1 | 5/2013 | Heller et al. |
| 2013/0117543 A1 | 5/2013 | Venkataramanan et al. |
| 2013/0138925 A1 | 5/2013 | Hickey et al. |
| 2013/0145128 A1 | 6/2013 | Schardt et al. |
| 2013/0148506 A1 | 6/2013 | Lea |
| 2013/0151215 A1 | 6/2013 | Mustapha |
| 2013/0159668 A1 | 6/2013 | Muff et al. |
| 2013/0159669 A1 | 6/2013 | Comparan et al. |
| 2013/0159674 A1 | 6/2013 | Muff et al. |
| 2013/0159675 A1 | 6/2013 | Muff et al. |
| 2013/0159676 A1 | 6/2013 | Muff et al. |
| 2013/0159944 A1 | 6/2013 | Uno et al. |
| 2013/0160026 A1 | 6/2013 | Kuesel et al. |
| 2013/0160114 A1 | 6/2013 | Greenwood et al. |
| 2013/0163615 A1 | 6/2013 | Mangano et al. |
| 2013/0174113 A1 | 7/2013 | Lecler et al. |
| 2013/0179613 A1 | 7/2013 | Boucard et al. |
| 2013/0179902 A1 | 7/2013 | Hoover et al. |
| 2013/0185542 A1 | 7/2013 | Mejdrich et al. |
| 2013/0191572 A1 | 7/2013 | Nooney et al. |
| 2013/0191600 A1 | 7/2013 | Kuesel et al. |
| 2013/0191649 A1 | 7/2013 | Muff et al. |
| 2013/0191651 A1 | 7/2013 | Muff et al. |
| 2013/0191824 A1 | 7/2013 | Muff et al. |
| 2013/0191825 A1 | 7/2013 | Muff et al. |
| 2013/0207801 A1 | 8/2013 | Barnes |
| 2013/0219148 A1 | 8/2013 | Chen et al. |
| 2013/0250792 A1 | 9/2013 | Yoshida et al. |
| 2013/0254488 A1 | 9/2013 | Kaxiras et al. |
| 2013/0263068 A1 | 10/2013 | Cho et al. |
| 2013/0268990 A1 | 10/2013 | Urzi et al. |
| 2013/0294458 A1 | 11/2013 | Yamaguchi et al. |
| 2013/0305207 A1 | 11/2013 | Hsieh et al. |
| 2013/0311819 A1 | 11/2013 | Ishii et al. |
| 2013/0326458 A1 | 12/2013 | Kazda et al. |
| 2014/0013293 A1 | 1/2014 | Hsu et al. |
| 2014/0068132 A1 | 3/2014 | Philip et al. |
| 2014/0068134 A1 | 3/2014 | Philip et al. |
| 2014/0082237 A1 | 3/2014 | Wertheimer et al. |
| 2014/0086260 A1 | 3/2014 | Dai et al. |
| 2014/0092740 A1 | 4/2014 | Wang et al. |
| 2014/0098683 A1 | 4/2014 | Kumar et al. |
| 2014/0112149 A1 | 4/2014 | Urzi et al. |
| 2014/0115218 A1 | 4/2014 | Philip et al. |
| 2014/0115298 A1 | 4/2014 | Philip et al. |
| 2014/0126572 A1 | 5/2014 | Hutton et al. |
| 2014/0143557 A1 | 5/2014 | Kuesel et al. |
| 2014/0143558 A1 | 5/2014 | Kuesel et al. |
| 2014/0149720 A1 | 5/2014 | Muff et al. |
| 2014/0164465 A1 | 6/2014 | Muff et al. |
| 2014/0164704 A1 | 6/2014 | Kuesel et al. |
| 2014/0164732 A1 | 6/2014 | Muff et al. |
| 2014/0164734 A1 | 6/2014 | Muff et al. |
| 2014/0211622 A1 | 7/2014 | Kumar et al. |
| 2014/0229709 A1 | 8/2014 | Kuesel et al. |
| 2014/0229712 A1 | 8/2014 | Muff et al. |
| 2014/0229713 A1 | 8/2014 | Muff et al. |
| 2014/0229714 A1 | 8/2014 | Muff et al. |
| 2014/0229720 A1 | 8/2014 | Hickey et al. |
| 2014/0230077 A1 | 8/2014 | Muff et al. |
| 2014/0232188 A1 | 8/2014 | Cheriyan et al. |
| 2014/0241376 A1 | 8/2014 | Balkan et al. |
| 2014/0254388 A1 | 9/2014 | Kumar et al. |
| 2014/0281243 A1 | 9/2014 | Shalf et al. |
| 2014/0281402 A1 | 9/2014 | Comparan et al. |
| 2014/0307590 A1 | 10/2014 | Dobbelaere et al. |
| 2014/0359641 A1 | 12/2014 | Clark et al. |
| 2014/0376569 A1 | 12/2014 | Philip et al. |
| 2015/0020078 A1 | 1/2015 | Kuesel et al. |
| 2015/0026435 A1 | 1/2015 | Muff et al. |
| 2015/0026494 A1 | 1/2015 | Bainbridge et al. |
| 2015/0026500 A1 | 1/2015 | Muff et al. |
| 2015/0032988 A1 | 1/2015 | Muff et al. |
| 2015/0032999 A1 | 1/2015 | Muff et al. |
| 2015/0043575 A1 | 2/2015 | Kumar et al. |
| 2015/0081941 A1 | 3/2015 | Brown et al. |
| 2015/0103822 A1 | 4/2015 | Gianchandani et al. |
| 2015/0109024 A1 | 4/2015 | Abdelfattah et al. |
| 2015/0159330 A1 | 6/2015 | Weisman et al. |
| 2015/0178435 A1 | 6/2015 | Kumar |
| 2015/0331831 A1 | 11/2015 | Solihin |
| 2015/0348600 A1 | 12/2015 | Bhatia et al. |
| 2015/0381707 A1 | 12/2015 | How |
| 2016/0344629 A1* | 11/2016 | Gray ............... H04L 45/60 |
| 2017/0061053 A1 | 3/2017 | Kumar et al. |
| 2017/0063625 A1 | 3/2017 | Philip et al. |
| 2017/0063697 A1 | 3/2017 | Kumar |

FOREIGN PATENT DOCUMENTS

| | | |
|---|---|---|
| JP | 6060316 B2 | 1/2017 |
| JP | 6093867 B2 | 2/2017 |
| KR | 10-2013-0033898 A1 | 4/2013 |
| KR | 101652490 | 8/2016 |
| KR | 101707655 | 2/2017 |
| WO | 2010074872 A1 | 7/2010 |
| WO | 2013063484 A1 | 5/2013 |
| WO | 2014059024 A1 | 4/2014 |

OTHER PUBLICATIONS

Abts, D., et al., Age-Based Packet Arbitration in Large-Radix k-ary n-cubes, Supercomputing 2007 (SC07), Nov. 10-16, 2007, 11 pgs.

Beretta, I, et al., A Mapping Flow for Dynamically Reconfigurable Multi-Core System-on-Chip Design, IEEE Transactions on Computer-Aided Design of Integrated Circuits and Systems, Aug. 2011, 30(8), pp. 1211-1224.

Das, R., et al., Aergia: Exploiting Packet Latency Slack in On-Chip Networks, 37th International Symposium on Computer Architecture (ISCA '10), Jun. 19-23, 2010, 11 pgs.

Ebrahimi, E., et al., Fairness via Source Throttling: A Configurable and High-Performance Fairness Substrate for Multi-Core Memory Systems, ASPLOS '10, Mar. 13-17, 2010, 12 pgs.

Gindin, R., et al., NoC-Based FPGA: Architecture and Routing, Proceedings of the First International Symposium on Networks-on-Chip (NOCS'07), May 2007, pp. 253-262.

Grot, B., Preemptive Virtual Clock: A Flexible, Efficient, and Cost-Effective QOS Scheme for Networks-on-Chip, Micro '09, Dec. 16, 2009, 12 pgs.

(56) References Cited

OTHER PUBLICATIONS

Grot, B., Kilo-NOC: A Heterogeneous Network-on-Chip Architecture for Scalability and Service Guarantees, ISCA 11, Jun. 4-8, 2011, 12 pgs.

Grot, B., Topology-Aware Quality-of-Service Support in Highly Integrated Chip Multiprocessors, 6th Annual Workshop on the Interaction between Operating Systems and Computer Architecture, Jun. 2006, 11 pgs.

Hestness, J., et al., Netrace: Dependency-Tracking for Efficient Network-on-Chip Experimentation, The University of Texas at Austin, Dept. of Computer Science, May 2011, 20 pgs.

Jiang, N., et al., Performance Implications of Age-Based Allocations in On-Chip Networks, CVA MEMO 129, May 24, 2011, 21 pgs.

Lee, J. W., et al., Globally-Synchronized Frames for Guaranteed Quality-of-Service in On-Chip Networks, 35th IEEE/ACM International Symposium on Computer Architecture (ISCA), Jun. 2008, 12 pgs.

Lee, M. M., et al., Approximating Age-Based Arbitration in On-Chip Networks, PACT '10, Sep. 11-15, 2010, 2 pgs.

Li, B., et al., CoQoS: Coordinating QoS-Aware Shared Resources in NoC-based SoCs, J. Parallel Distrib. Comput., 71(5), May 2011, 14 pgs.

Lin, S., et al., Scalable Connection-Based Flow Control Scheme for Application-Specific Network-on-Chip, The Journal of China Universities of Posts and Telecommunications, Dec. 2011, 18(6), pp. 98-105.

Bolotin, Evgency, et al., "QNoC: QoS Architecture and Design Process for Network on Chip" 2004, 24 pages, Journal of Systems Architecture 50 (2004) 105-128 Elsevier.

Holsmark, Shashi Kumar Rickard, et al., "HiRA: A Methodology for Deadlock Free Routing in Hierarchical Networks on Chip", 10 pages, (978-1-4244-4143-3/09 2009 IEEE).

Munirul, H.M., et al., Evaluation of Multiple-Valued Packet Multiplexing Scheme for Network-on-Chip Architecture, Proceedings of the 36th International Symposium on Multiple-Valued Logic (ISMVL '06), 2006, 6 pgs.

Rajesh BV, Shivaputra, "NOC: Design and Implementation of Hardware Network Interface With Improved Communication Reliability", 7 pages, International Journal of VLSI and Embedded Systems, Ijives (vol. 04, Article 06116; Jun. 2013).

Yang, J., et al., Homogeneous NoC-based FPGA: The Foundation for Virtual FPGA, 10th IEEE International Conference on Computer and Information Technology (CIT 2010), Jun. 2010, pp. 62-67.

Zaman, Aanam, "Formal Verification of Circuit-Switched Network on Chip (NoC) Architectures using SPIN", Oosman Hasan, IEEE © 2014, 8 pages.

Benini, Luca, et al., "Networks on Chips: A New SoC Paradigm", IEEE Computers, SOC Designs, pp. 70-78, Copyright 2002 IEEE. 0018-9162/02.

Sethuraman, Ranga Vemuri Balasubramanian, "optiMap: A Tool for Automated Generation of NoC Architecture Using Multi-Port Routers for FPGAs", IEEE, pp. 1-6, 2006.

International Search Report and Written Opinion for PCT/US2014/060745, dated Jan. 21, 2015, 10 pgs.

International Search Report and Written Opinion for PCT/US2014/060879, dated Jan. 21, 2015, 10 pgs.

International Search Report and Written Opinion for PCT/US2014/060892, dated Jan. 27, 2015, 10 pgs.

International Search Report and Written Opinion for PCT/US2014/060886, dated Jan. 26, 2015, 10 pgs.

International Search Report and Written Opinion for PCT/US2013/064140, dated Jan. 22, 2014, 9 pgs.

International Search Report and Written Opinion for PCT/US2014/012003, dated Mar. 26, 2014, 9 pgs.

International Search Report and Written Opinion for PCT/US2014/012012, dated May 14, 2014, 9 pgs.

International Search Report and Written Opinion for PCT/US2014/023625, dated Jul. 10, 2014, 9 pgs.

International Preliminary Report on Patentability for International Application No. PCT/US2013/064140, dated Apr. 14, 2015, 5 pages.

Office Action for Korean Patent Application No. 10-2016-7019093 dated Sep. 8, 2016, 3 pages plus 1 page English translation. KIPO, Korea.

Notice of Allowance for for Korean Patent Application No. 10-2016-7019093 dated Sep. 8, 2016, 4 pages. KIPO, Korea.

International Search Report and Written Opinion for PCT/US2014/037902, dated Sep. 30, 2014, 14 pgs.

Office Action for Japanese Patent Application No. 2015-535898 dated Oct. 25, 2016, 2 pages English, 2 pages untranslated copy. Japan Patent Office.

Notice of Grant for Japanese Patent Application No. 2015-535898 dated Jan. 17, 2017, 3 pages, untranslated. Japan Patent Office.

International Search Report and Written Opinion for PCT/US2014/048190, dated Nov. 28, 2014, 11 pgs.

Office Action for Japanese Patent Application No. 2016-516030 dated Aug. 30, 2016, 2 pages, Japan Patent Office.

Decision to Grant for Japanese Patent Application No. 2016-516030 dated Nov. 22, 2016, 6 pages, untranslated, Japan Patent Office.

\* cited by examiner (Related Art)

(Related Art)

APPLICATION MAPPING ON HARDENED NETWORK-ON-CHIP (NOC) OF FIELD-PROGRAMMABLE GATE ARRAY (FPGA)

CROSS REFERENCE TO RELATED APPLICATION

This U.S. patent application is based on and claims the benefit of domestic priority under 35 U.S.C 119(e) from provisional U.S. patent application No. 62/634,587, filed on Feb. 23, 2018, the disclosure of which is hereby incorporated by reference herein in its entirety.

TECHNICAL FIELD

Methods and example implementations described herein are generally directed to Field-Programmable Gate-Arrays (FPGAs) or other programmable logic devices (PLDs) or other devices based thereon, and more specifically, to the addition of networks-on-chip (NoC) to FPGAs to customize traffic and optimize performance. This includes both modifications to the FPGA architecture and design flow.

RELATED ART

The number of components on a chip is rapidly growing due to increasing levels of integration, system complexity and shrinking transistor geometry. Complex System-on-Chips (SoCs) may involve a variety of components e.g., processor cores, DSPs, hardware accelerators, memory and I/O, while Chip Multi-Processors (CMPs) may involve a large number of homogenous processor cores, memory and I/O subsystems. In both SoC and CMP systems, the on-chip interconnect plays a role in providing high-performance communication between the various components. Due to scalability limitations of traditional buses and crossbar based interconnects, Network-on-Chip (NoC) has emerged as a paradigm to interconnect a large number of components on the chip. NoC is a global shared communication infrastructure made up of several routing nodes interconnected with each other using point-to-point physical links.

Messages are injected by the source and are routed from the source node to the destination over multiple intermediate nodes and physical links. The destination node then ejects the message and provides the message to the destination. For the remainder of this application, the terms 'components', 'blocks', 'hosts' or 'cores' will be used interchangeably to refer to the various system components which are interconnected using a NoC. Terms 'routers' and 'nodes' will also be used interchangeably. Without loss of generalization, the system with multiple interconnected components will itself be referred to as a 'multi-core system'.

There are several topologies in which the routers can connect to one another to create the system network. Bi-directional rings (as shown in FIG. 1A, 2-D (two dimensional) mesh (as shown in FIG. 1B), and 2-D Torus (as shown in FIG. 1C) are examples of topologies in the related art. Mesh and Torus can also be extended to 2.5-D (two and half dimensional) or 3-D (three dimensional) organizations. FIG. 1D shows a 3D mesh NoC, where there are three layers of 3×3 2D mesh NoC shown over each other. The NoC routers have up to two additional ports, one connecting to a router in the higher layer, and another connecting to a router in the lower layer. Router 111 in the middle layer of the example has its ports used, one connecting to the router 112 at the top layer and another connecting to the router 110 at the bottom layer. Routers 110 and 112 are at the bottom and top mesh layers respectively and therefore have only the upper facing port 113 and the lower facing port 114 respectively connected.

Packets are message transport units for intercommunication between various components. Routing involves identifying a path that is a set of routers and physical links of the network over which packets are sent from a source to a destination. Components are connected to one or multiple ports of one or multiple routers; with each such port having a unique identification (ID). Packets can carry the destination's router and port ID for use by the intermediate routers to route the packet to the destination component.

Examples of routing techniques include deterministic routing, which involves choosing the same path from A to B for every packet. This form of routing is independent from the state of the network and does not load balance across path diversities, which might exist in the underlying network. However, such deterministic routing may implemented in hardware, maintains packet ordering and may be rendered free of network level deadlocks. Shortest path routing may minimize the latency as such routing reduces the number of hops from the source to the destination. For this reason, the shortest path may also be the lowest power path for communication between the two components. Dimension-order routing is a form of deterministic shortest path routing in 2-D, 2.5-D, and 3-D mesh networks. In this routing scheme, messages are routed along each coordinates in a particular sequence until the message reaches the final destination. For example in a 3-D mesh network, one may first route along the X dimension until it reaches a router whose X-coordinate is equal to the X-coordinate of the destination router. Next, the message takes a turn and is routed in along Y dimension and finally takes another turn and moves along the Z dimension until the message reaches the final destination router. Dimension ordered routing may be minimal turn and shortest path routing.

FIG. 2A pictorially illustrates an example of XY routing in a two dimensional mesh. More specifically, FIG. 2A illustrates XY routing from node '34' to node '00'. In the example of FIG. 2A, each component is connected to only one port of one router. A packet is first routed over the X-axis till the packet reaches node '04' where the X-coordinate of the node is the same as the X-coordinate of the destination node. The packet is next routed over the Y-axis until the packet reaches the destination node.

In heterogeneous mesh topology in which one or more routers or one or more links are absent, dimension order routing may not be feasible between certain source and destination nodes, and alternative paths may have to be taken. The alternative paths may not be shortest or minimum turn.

Source routing and routing using tables are other routing options used in NoC. Adaptive routing can dynamically change the path taken between two points on the network based on the state of the network. This form of routing may be complex to analyze and implement.

A NoC interconnect may contain multiple physical networks. Over each physical network, there exist multiple virtual networks, wherein different message types are transmitted over different virtual networks. In this case, at each physical link or channel, there are multiple virtual channels; each virtual channel may have dedicated buffers at both end points. In any given clock cycle, only one virtual channel can transmit data on the physical channel.

NoC interconnects may employ wormhole routing, wherein, a large message or packet is broken into small pieces known as flits (also referred to as flow control digits). The first flit is a header flit, which holds information about this packet's route and key message level info along with payload data and sets up the routing behavior for all subsequent flits associated with the message. Optionally, one or more body flits follows the header flit, containing remaining payload of data. The final flit is a tail flit, which, in addition to containing last payload, also performs some bookkeeping to close the connection for the message. In wormhole flow control, virtual channels are often implemented.

The physical channels are time sliced into a number of independent logical channels called virtual channels (VCs). VCs provide multiple independent paths to route packets, however they are time-multiplexed on the physical channels. A virtual channel holds the state needed to coordinate the handling of the flits of a packet over a channel. At a minimum, this state identifies the output channel of the current node for the next hop of the route and the state of the virtual channel (idle, waiting for resources, or active). The virtual channel may also include pointers to the flits of the packet that are buffered on the current node and the number of flit buffers available on the next node.

The term "wormhole" plays on the way messages are transmitted over the channels: the output port at the next router can be so short that received data can be translated in the head flit before the full message arrives. This allows the router to quickly set up the route upon arrival of the head flit and then opt out from the rest of the conversation. Since a message is transmitted flit by flit, the message may occupy several flit buffers along its path at different routers, creating a worm-like image.

Based upon the traffic between various end points, and the routes and physical networks that are used for various messages, different physical channels of the NoC interconnect may experience different levels of load and congestion. The capacity of various physical channels of a NoC interconnect is determined by the width of the channel (number of physical wires) and the clock frequency at which it is operating. Various channels of the NoC may operate at different clock frequencies, and various channels may have different widths based on the bandwidth requirement at the channel. The bandwidth requirement at a channel is determined by the flows that traverse over the channel and their bandwidth values. Flows traversing over various NoC channels are affected by the routes taken by various flows. In a mesh or Torus NoC, there exist multiple route paths of equal length or number of hops between any pair of source and destination nodes. For example, in FIG. 2B, in addition to the standard XY route between nodes 34 and 00, there are additional routes available, such as YX route 203 or a multi-turn route 202 that makes more than one turn from source to destination.

In a NoC with statically allocated routes for various traffic slows, the load at various channels may be controlled by intelligently selecting the routes for various flows. When a large number of traffic flows and substantial path diversity is present, routes can be chosen such that the load on all NoC channels is balanced nearly uniformly, thus avoiding a single point of bottleneck. Once routed, the NoC channel widths can be determined based on the bandwidth demands of flows on the channels. Unfortunately, channel widths cannot be arbitrarily large due to physical hardware design restrictions, such as timing or wiring congestion. There may be a limit on the maximum channel width, thereby putting a limit on the maximum bandwidth of any single NoC channel.

Additionally, wider physical channels may not help in achieving higher bandwidth if messages are short. For example, if a packet is a single flit packet with a 64-bit width, then no matter how wide a channel is, the channel will only be able to carry 64 bits per cycle of data if all packets over the channel are similar. Thus, a channel width is also limited by the message size in the NoC. Due to these limitations on the maximum NoC channel width, a channel may not have enough bandwidth in spite of balancing the routes.

To address the above bandwidth concern, multiple parallel physical NoCs may be used. Each NoC may be called a layer, thus creating a multi-layer NoC architecture. Hosts inject a message on a NoC layer; the message is then routed to the destination on the NoC layer, where it is delivered from the NoC layer to the host. Thus, each layer operates more or less independently from each other, and interactions between layers may only occur during the injection and ejection times. FIG. 3A illustrates a two layer NoC. Here the two NoC layers are shown adjacent to each other on the left and right, with the hosts connected to the NoC replicated in both left and right diagrams. A host is connected to two routers in this example—a router in the first layer shown as R1, and a router is the second layer shown as R2. In this example, the multi-layer NoC is different from the 3D NoC, i.e. multiple layers are on a single silicon die and are used to meet the high bandwidth demands of the communication between hosts on the same silicon die. Messages do not go from one layer to another. For purposes of clarity, the present application will utilize such a horizontal left and right illustration for multi-layer NoC to differentiate from the 3D NoCs, which are illustrated by drawing the NoCs vertically over each other.

In FIG. 3B, a host connected to a router from each layer, R1 and R2 respectively, is illustrated. Each router is connected to other routers in its layer using directional ports 301, and is connected to the host using injection and ejection ports 302. A bridge-logic 303 may sit between the host and the two NoC layers to determine the NoC layer for an outgoing message and sends the message from host to the NoC layer, and also perform the arbitration and multiplexing between incoming messages from the two NoC layers and delivers them to the host.

In a multi-layer NoC, the number of layers needed may depend upon a number of factors such as the aggregate bandwidth requirement of all traffic flows in the system, the routes that are used by various flows, message size distribution, maximum channel width, etc. Once the number of NoC layers in NoC interconnect is determined in a design, different messages and traffic flows may be routed over different NoC layers. Additionally, one may design NoC interconnects such that different layers have different topologies in number of routers, channels and connectivity. The channels in different layers may have different widths based on the flows that traverse over the channel and their bandwidth requirements.

System on Chips (SoCs) are becoming increasingly sophisticated, feature rich, and high performance by integrating a growing number of standard processor cores, memory and I/O subsystems, and specialized acceleration IPs. To address this complexity, NoC approach of connecting SoC components is gaining popularity. A NoC can provide connectivity to a plethora of components and interfaces and simultaneously enable rapid design closure by being automatically generated from a high level specification. The specification describes interconnect requirements of SoC in terms of connectivity, bandwidth, and latency. In addition to this, information such as position of various components such as bridges or ports on boundary of hosts, traffic information, chip size information, etc. may be supplied. A NoC compiler (topology generation engine) can then use this specification to automatically design a NoC for the SoC. A number of NoC compilers were introduced in the related art that automatically synthesize a NoC to fit a traffic specification. In such design flows, the synthesized NoC is simulated to evaluate the performance under various operating conditions and to determine whether the specifications are met. This may be necessary because NoC-style interconnects are distributed systems and their dynamic performance characteristics under load are difficult to predict statically and can be very sensitive to a wide variety of parameters. Specifications can also be in the form of power specifications to define power domains, voltage domains, clock domains, and so on, depending on the desired implementation.

Placing hosts/IP cores in a SoC floorplan to optimize the interconnect performance can be important. For example, if two hosts communicate with each other frequently and require higher bandwidth than other interconnects, it may be better to place them closer to each other so that the transactions between these hosts can go over fewer router hops and links and the overall latency and the NoC cost can be reduced.

Assuming that two hosts with certain shapes and sizes cannot spatially overlap with each other on a 2D SoC plane, tradeoffs may need to be made. Moving certain hosts closer to improve inter-communication between them, may force certain other hosts to be further apart, thereby penalizing inter-communication between those other hosts. To make tradeoffs that improve system performance, certain performance metrics such as average global communication latency may be used as an objective function to optimize the SoC architecture with the hosts being placed in a NoC topology. Determining substantially optimal host positions that maximizes the system performance metric may involve analyzing the connectivity and inter-communication properties between all hosts and judiciously placing them onto the 2D NoC topology. In case if inter-communicating hosts are placed far from each other, this can leads to high average and peak structural latencies in number of hops. Such long paths not only increase latency but also adversely affect the interconnect bandwidth, as messages stay in the NoC for longer periods and consume bandwidth of a large number of links.

Also, existing integrated circuits such as programmable logic devices (PLDs) typically utilize "point-to-point" routing, meaning that a path between a source signal generator and one or more destinations is generally fixed at compile time. For example, a typical implementation of an A-to-B connection in a PLD involves connecting logic areas through an interconnect stack of pre—defined horizontal wires. These horizontal wires have a fixed length, are arranged into bundles, and are typically reserved for that A-to-B connection for the entire operation of the PLDs configuration bit stream. Even where a user is able to subsequently change some features of the point-to-point routing, e.g., through partial recompilation, such changes generally apply to block-level replacements, and not to cycle-by-cycle routing implementations.

Such existing routing methods may render the device inefficient, e.g., when the routing is not used every cycle. A first form of inefficiency occurs because of inefficient wire use. In a first example, when an A-to-B connection is rarely used (for example, if the signal value generated by the source logic area at A rarely changes or the destination logic area at B is rarely programmed to be affected by the result), then the conductors used to implement the A-to-B connection may unnecessarily take up metal, power, and/or logic resources. In a second example, when a multiplexed bus having N inputs is implemented in a point-to-point fashion, metal resources may be wasted on routing data from each of the N possible input wires because the multiplexed bus, by definition, outputs only one of the N input wires and ignores the other N−1 input wires. Power resources may also be wasted in these examples when spent in connection with data changes that do not affect a later computation. A more general form of this inefficient wire use occurs when more than one producer generates data that is serialized through a single consumer or the symmetric case where one producer produces data that is used in a round-robin fashion by two or more consumers.

A second form of inefficiency, called slack-based inefficiency, occurs when a wire is used, but below its full potential, e.g., in terms of delay. For example, if the data between a producer and a consumer is required to be transmitted every 300 ps, and the conductor between them is capable of transmitting the data in a faster, 100 ps timescale, then the 200 ps of slack time in which the conductor is idle is a form of inefficiency or wasted bandwidth. These two forms of wire underutilization, e.g., inefficient wire use and slack-based inefficiency, can occur separately or together, leading to inefficient use of resources, and wasting valuable wiring, power, and programmable multiplexing resources.

In many cases, the high-level description of the logic implemented on a PLD may already imply sharing of resources, such as sharing access to an external memory or a high-speed transceiver. To do this, it is common to synthesize higher-level structures representing busses onto PLDs. In one example, a software tool may generate an industry-defined bus as Register-Transfer-Level (RTL)/Verilog logic, which is then synthesized into an FPGA device. In this case, however, that shared bus structure is still implemented in the manner discussed above, meaning that it is actually converted into point-to-point static routing. Even in a scheme involving time-multiplexing of FPGA wires, routing is still limited to an individual-wire basis and does not offer grouping capabilities.

In large-scale networks, efficiency and performance/area tradeoff is of main concern. Mechanisms such as machine learning approach, simulation annealing, among others, provide optimized topology for a system. However, such complex mechanisms have substantial limitations as they involve certain algorithms to automate optimization of layout network, which may violate previously mapped flow's latency constraint or the latency constraint of current flow. Further, it is also to be considered that each user has their own requirements and/or need for SoCs and/or NoCs depending on a diverse applicability of the same. Therefore, there is a need for systems and methods that significantly improve system efficiency by accurately indicating the best possible positions and configurations for hosts and ports within the hosts, along with indicating system level routes to be taken for traffic flows using the NoC interconnect architecture. Systems and methods are also required for automatically generating an optimized topology for a given SoC floor plan and traffic specification with an efficient layout. Further, systems and methods are also required that allows users to specify their requirements for a particular SoC and/or NoC, provides various options for satisfying their requirements and based on this automatically generating an optimized topology for a given SoC floor plan and traffic specification with an efficient layout.

Integrating NoC with FPGA since bandwidth requirements are increasing rapidly and FPGAs are becoming bigger and bigger. However, FPGAs are becoming bigger and bigger the conventional soft logic to provide sufficient bandwidth is also growing rapid which are not achieved by the conventional techniques. Thus there is requirement of provide a combination of hardened logic and soft logic to provide a probability of achieving the requirements.

Also, once the hardened NoC is built over the FPGA, there is a need for mapping the traffic incoming and outgoing to a particular layer or merchant channel of within layer routing their needs a flexibility to choose route for the traffic (since there are multiple routes present).

In a NoC interconnect, if the traffic profile is not uniform and there is a certain amount of heterogeneity (e.g., certain hosts talking to each other more frequently than the others), the interconnect performance may depend on the NoC topology and where various hosts are placed in the topology with respect to each other and to what routers they are connected to. For example, if two hosts talk to each other frequently and require higher bandwidth than other interconnects, then they should be placed next to each other. This will reduce the latency for this communication which thereby reduces the global average latency, as well as reduce the number of router nodes and links over which the higher bandwidth of this communication must be provisioned.

Moving two hosts closer together may make certain other hosts far apart since all hosts must fit into the 2D planar NoC topology without overlapping with each other. Thus, various tradeoffs must be made and the hosts must be placed after examining the pair-wise bandwidth and latency requirements between all hosts so that certain global cost and performance metrics is optimized. The cost and performance metrics can be, for example, average structural latency between all communicating hosts in number of router hops, or sum of bandwidth between all pair of hosts and the distance between them in number of hops, or some combination of these two. This optimization problem is known to be NP-hard and heuristic based approaches are often used. The hosts in a system may vary in shape and sizes with respect to each other, which puts additional complexity in placing them in a 2D planar NoC topology, packing them optimally while leaving little whitespaces, and avoiding overlapping hosts.

The optimization approaches introduced so far to determine the channel capacity, routes, host positions, etc., are useful when the exact traffic profile is known in advance at the NoC design time. If the precise traffic profile is not known at the design time, and the traffic profile changes during the NoC operation based on the SoC application's requirements, then the NoC design must allow these adjustments. For the NoC to allow these changes, the NoC must be designed so that it has knowledge of the changes that may occur in the traffic profile in a given system and ensure that any combination of allowable traffic profiles are supported by the NoC hardware architecture.

Therefore, there exists a need for methods, systems, and computer readable mediums for overcoming the above-mentioned issues with existing implementations of generating topology for a given NoC. Further, there exists a need for methods, systems, and computer readable mediums for having a programmable fabric and a communication network integrated with the programmable fabric for high-speed data passing.

SUMMARY

Methods and example implementations described herein are generally directed to Field-Programmable Gate-Arrays (FPGAs) or other programmable logic devices (PLDs) or other devices based thereon, and more specifically, to the addition of networks-on-chip (NoC) to FPGAs to customize traffic and optimize performance. This includes both modifications to the FPGA architecture and design flow.

Aspects of the present application relate to methods, systems, and computer readable mediums for overcoming the above-mentioned issues with existing implementations of generating topology for a given NoC by significantly improving system efficiency by facilitating efficient creation of NoC designs utilizing existing or new circuit block information. The system and method provides a programmable fabric and a communication network integrated with the programmable fabric for high-speed data passing.

An aspect of the present application relates to a Field-Programmable Gate-Array (FPGA) system. The FPGA system can include an FPGA having one or more lookup tables (LUTs) and wires, and a Network-on-Chip (NoC) having a hardened network topology configured to provide connectivity at a higher frequency that the FPGA. The NoC is coupled to the FPGA to receive an profile information associated with an application, retrieve at least a characteristic, selected form any of combination of any or combination of a bandwidth requirement, latency requirement, protocol requirement and transactions, associated with the application from the profile information, generate at least one application traffic graph having mapping information based on the characteristic retrieved, and map the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the system is further configured to determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

An aspect of the present application is to provide a method that include the steps of receiving an profile information associated with an application by a Network-on-Chip (NoC), retrieving at least a characteristic, selected from any or combination of a bandwidth requirement, latency requirement, protocol requirement and transactions, associated with the application from the profile information, generating at least one application traffic graph having mapping information based on the characteristic retrieved, and mapping the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the method can further determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

An aspect of the present application relates to a non-transitory computer readable storage medium storing instructions for executing a process. The instructions include the steps of receiving an profile information associated with an application, retrieving at least a characteristic, selected from any or combination of a bandwidth requirement, latency requirement, protocol requirement and transactions, associated with the application from the profile information, generating at least one application traffic graph having mapping information based on the characteristic retrieved, and mapping the application traffic graph generated with into the FPGA using the hardened NoC.

The foregoing and other objects, features and advantages of the example implementations will be apparent and the following more particular descriptions of example implementations as illustrated in the accompanying drawings wherein like reference numbers generally represent like parts of exemplary implementations of the application.

DETAILED DESCRIPTION

Figure 1A:
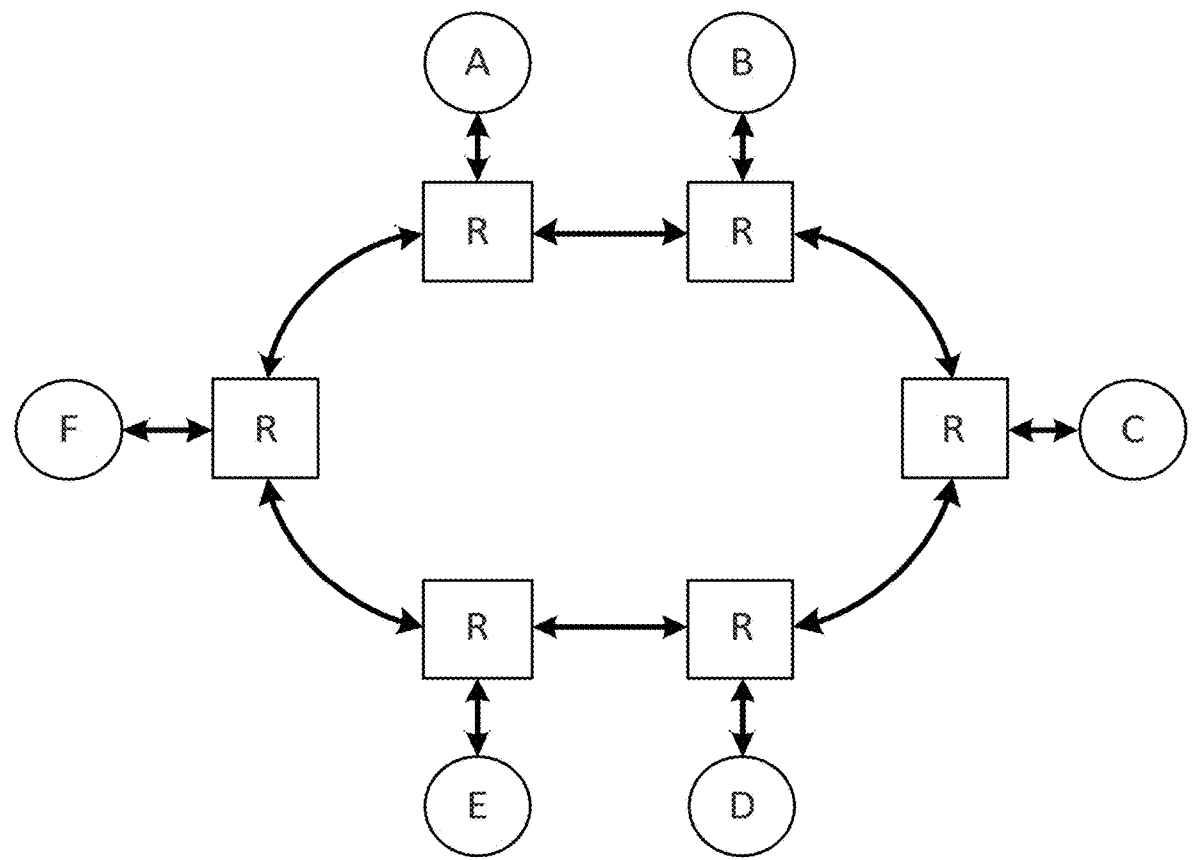
FIGS. 1A, 1B, 1C, and 1D illustrate examples of Bidirectional ring, 2D Mesh, 2D Torus, and 3D Mesh NoC Topologies.
Figure 1B:
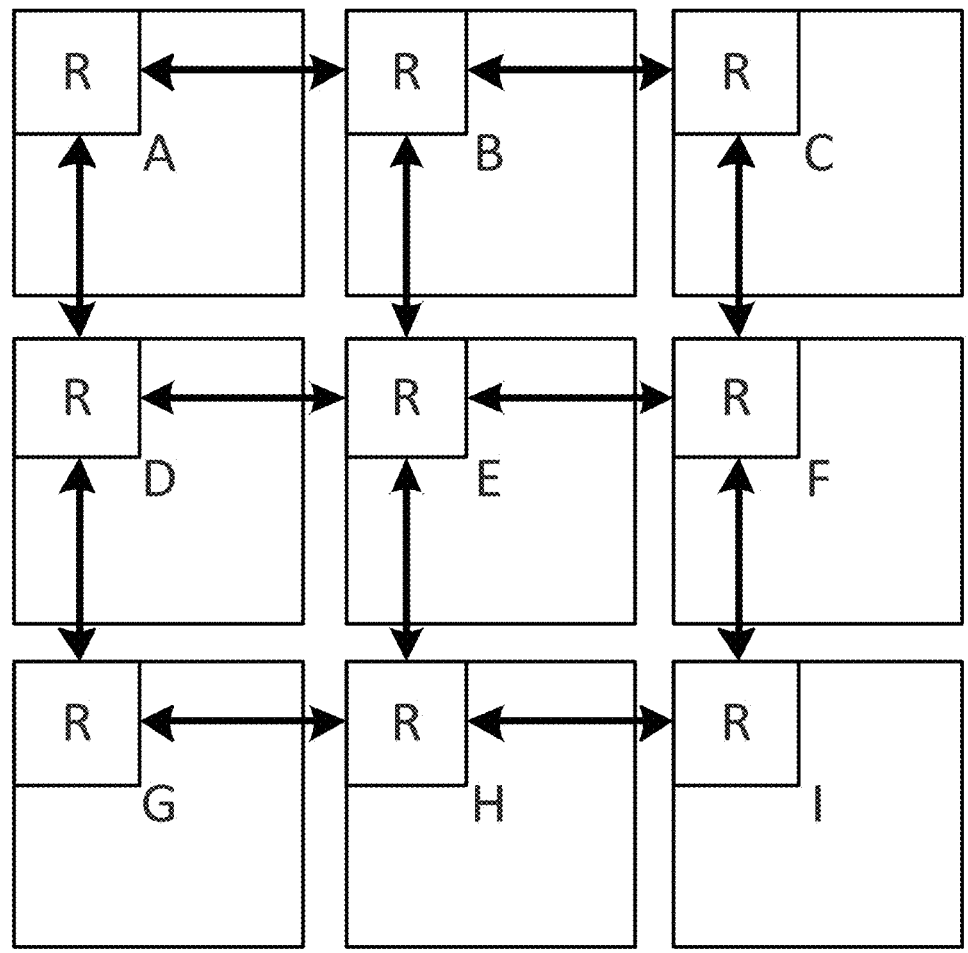
Figure 1C:
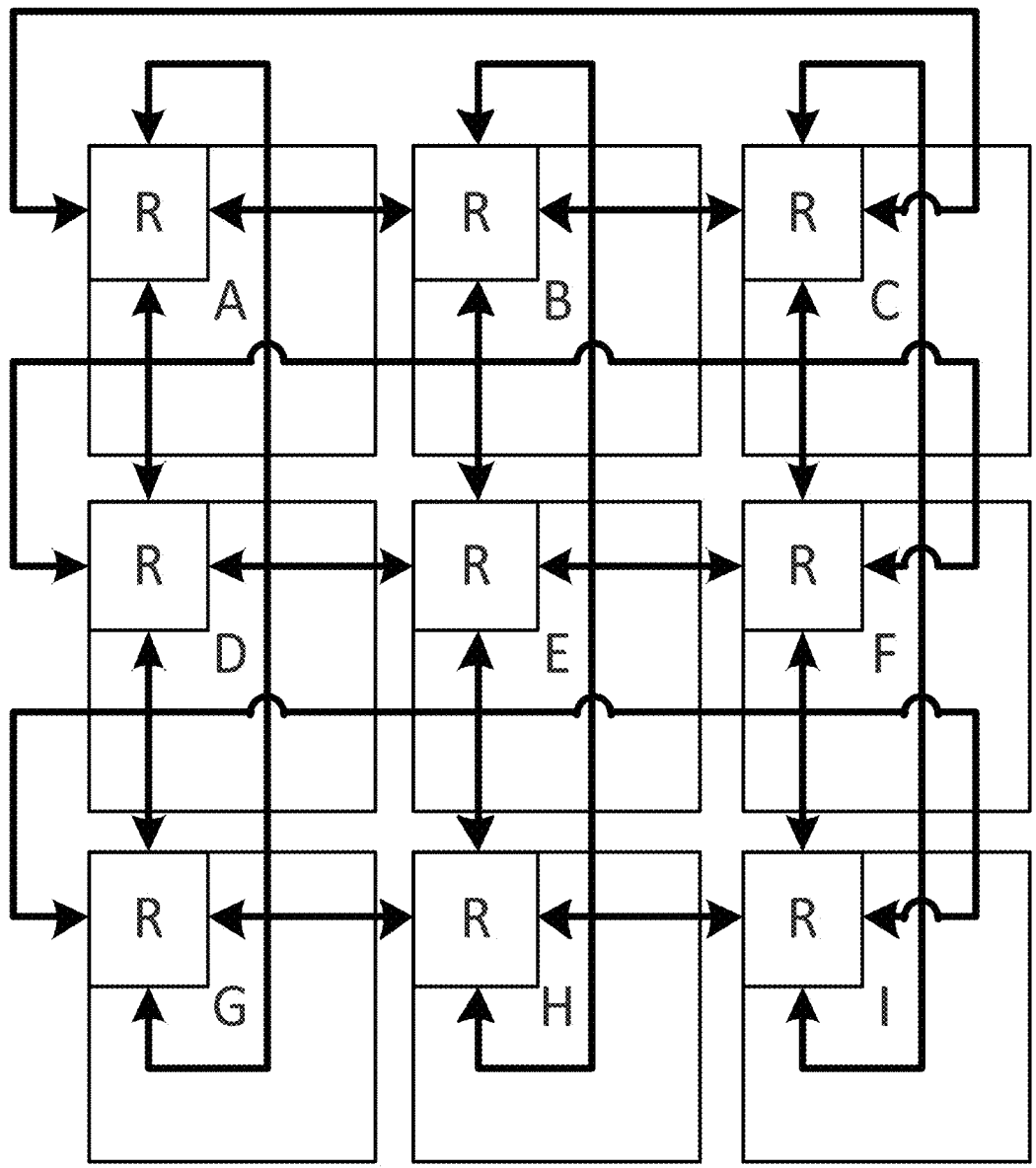
Figure 1D:
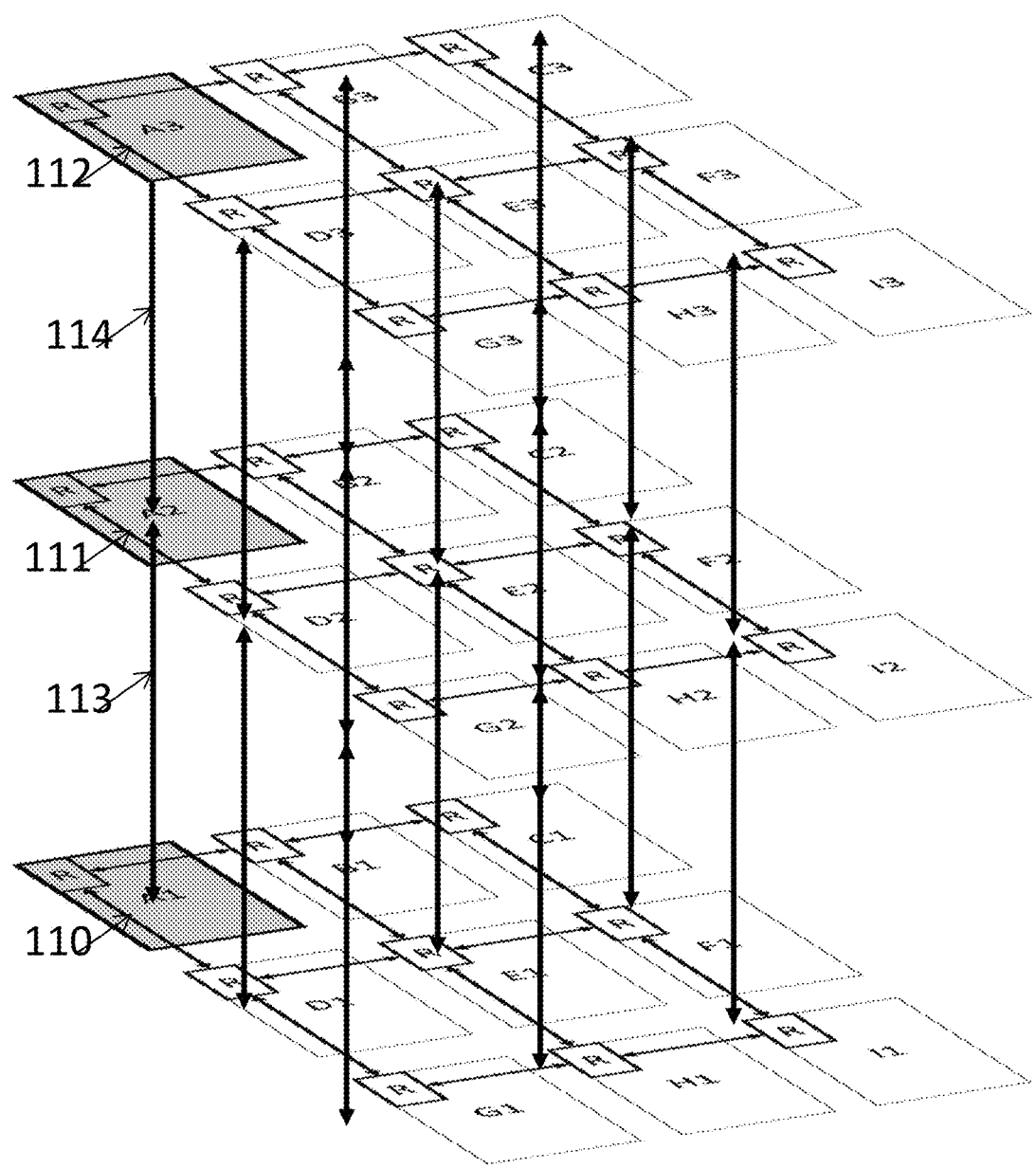
Figure 2A:
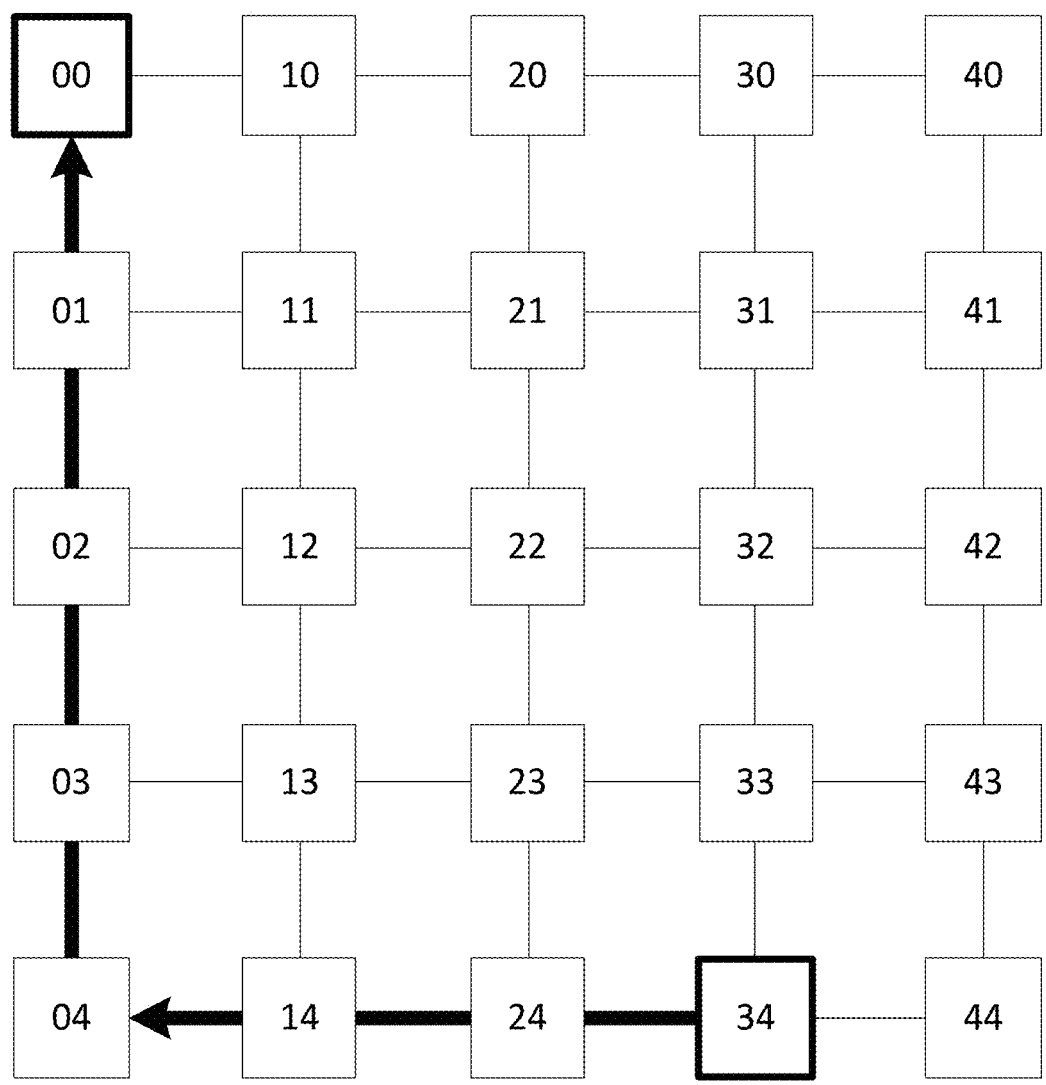
FIG. 2A illustrates an example of XY routing in a related art two dimensional mesh.
Figure 2B:
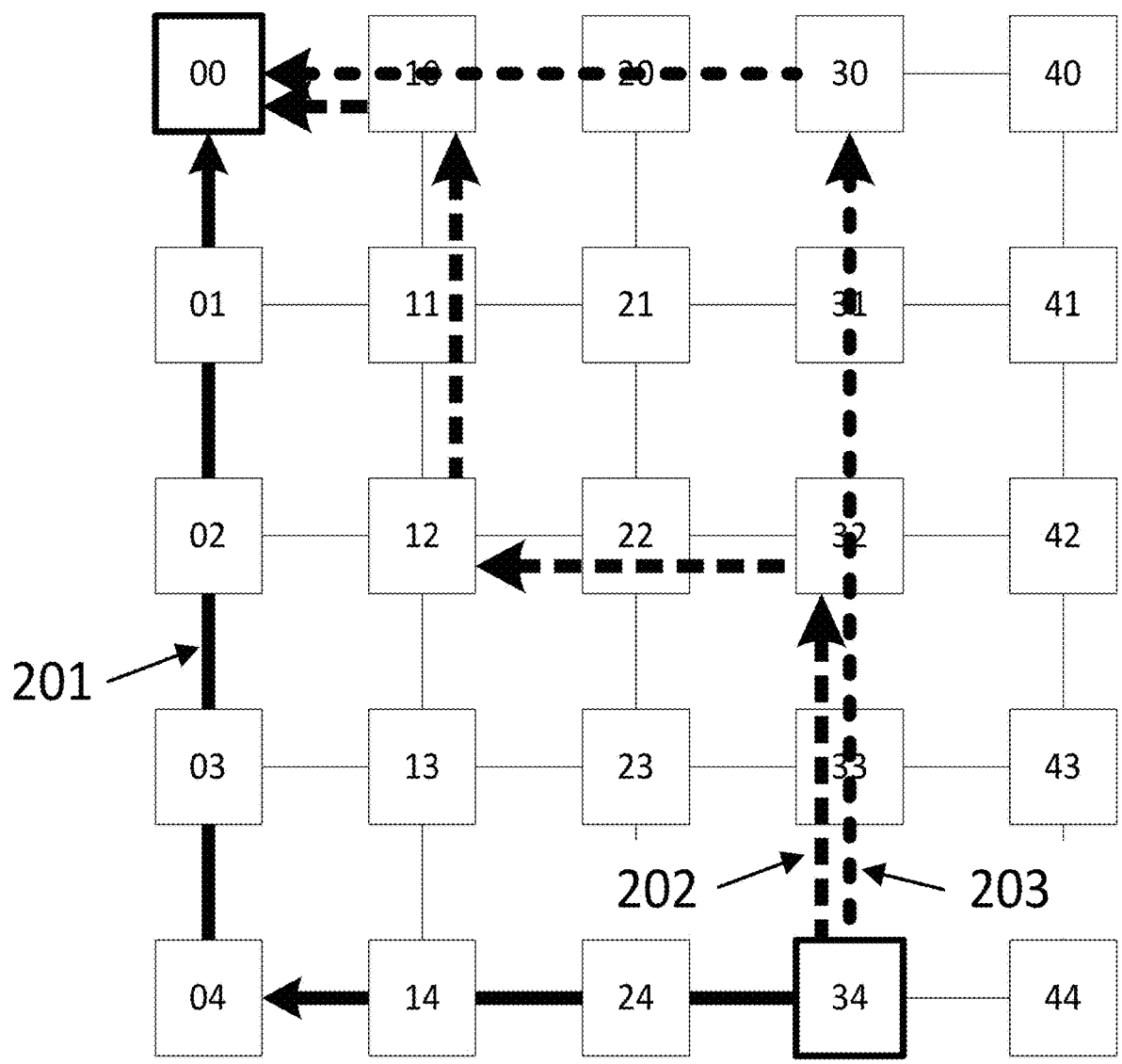
FIG. 2B illustrates three different routes between a source and destination nodes.
Figure 3A:
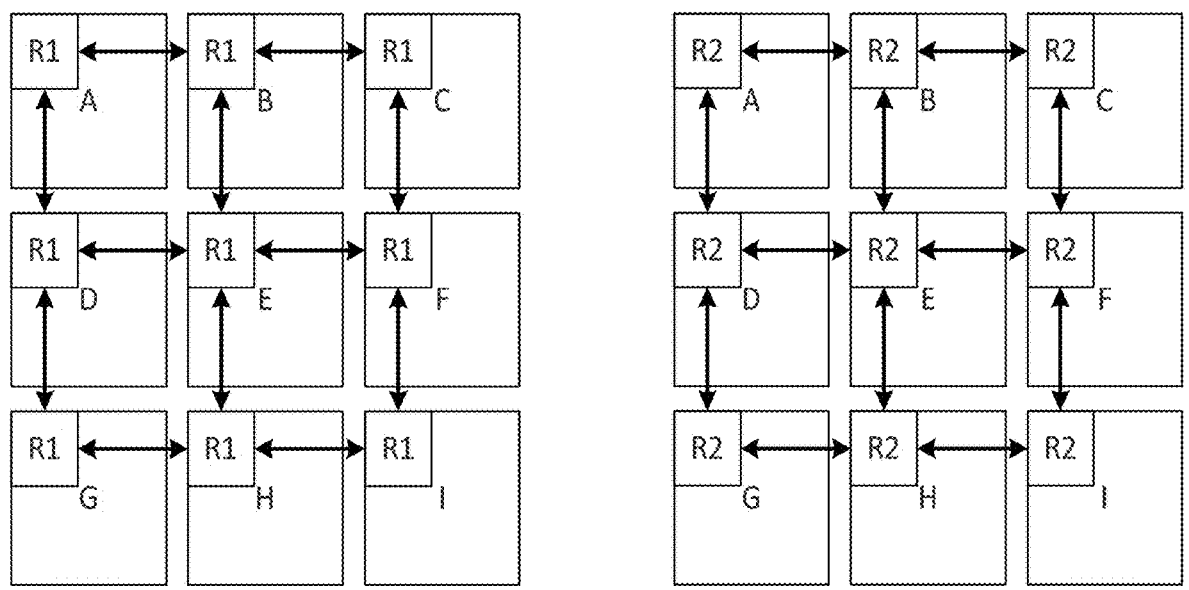
FIG. 3A illustrates an example of a related art two layer NoC interconnect.
Figure 3B:
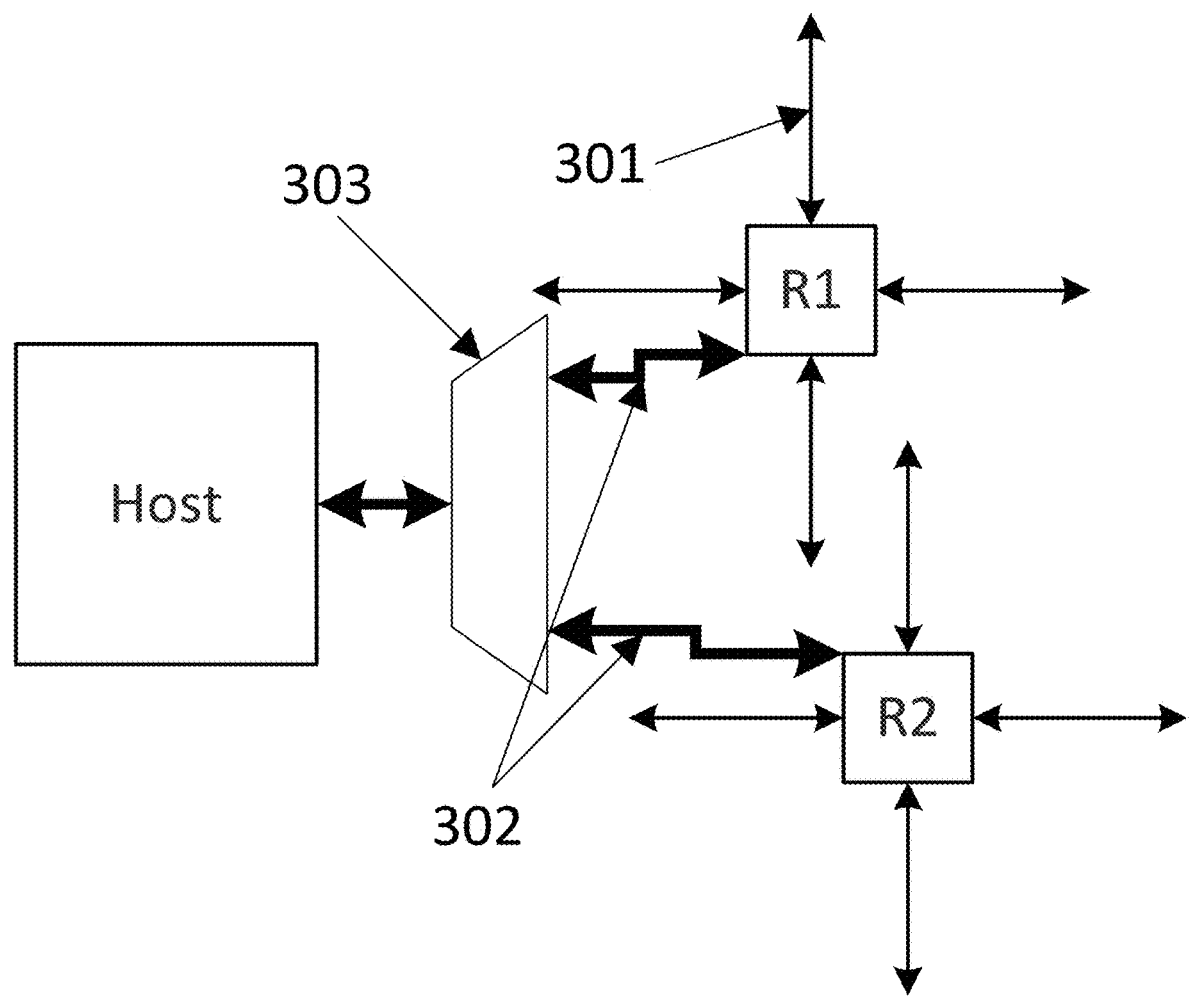
FIG. 3B illustrates the related art bridge logic between host and multiple NoC layers.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application.

Network-on-Chip (NoC) has emerged as a paradigm to interconnect a large number of components on the chip. NoC is a global shared communication infrastructure made up of several routing nodes interconnected with each other using point-to-point physical links. In example implementations, a NoC interconnect is generated from a specification by utilizing design tools. The specification can include constraints such as bandwidth/Quality of Service (QoS)/latency attributes that is to be met by the NoC, and can be in various software formats depending on the design tools utilized. Once the NoC is generated through the use of design tools on the specification to meet the specification requirements, the physical architecture can be implemented either by manufacturing a chip layout to facilitate the NoC or by generation of a register transfer level (RTL) for execution on a chip to emulate the generated NoC, depending on the desired implementation. Specifications may be in common power format (CPF), Unified Power Format (UPF), or others according to the desired specification. Specifications can be in the form of traffic specifications indicating the traffic, bandwidth requirements, latency requirements, interconnections, etc. depending on the desired implementation. Specifications can also be in the form of power specifications to define power domains, voltage domains, clock domains, and so on, depending on the desired implementation.

Methods and example implementations described herein are generally directed to Field-Programmable Gate-Arrays (FPGAs) or other programmable logic devices (PLDs) or other devices based thereon, and more specifically, to the addition of networks-on-chip (NoC) to FPGAs to customize traffic and optimize performance. This includes both modifications to the FPGA architecture and design flow.

Aspects of the present application relate to methods, systems, and computer readable mediums for overcoming the above-mentioned issues with existing implementations of generating topology for a given NoC by significantly improving system efficiency by facilitating efficient creation of NoC designs utilizing existing or new circuit block information. The system and method provides a programmable fabric and a communication network integrated with the programmable fabric for high-speed data passing.

An aspect of the present application relates to a Field-Programmable Gate-Array (FPGA) system. The FPGA system can include an FPGA having one or more lookup tables (LUTs) and wires, and a Network-on-Chip (NoC) having a hardened network topology configured to provide connectivity at a higher frequency that the FPGA. The NoC is coupled to the FPGA to receive an profile information associated with an application, retrieve at least a characteristic, selected form any of combination of any or combination of a bandwidth requirement, latency requirement, protocol requirement and transactions, associated with the application from the profile information, generate at least one application traffic graph having mapping information based on the characteristic retrieved, and map the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the system is further configured to determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

An aspect of the present application is to provide a method that include the steps of receiving an profile information associated with an application by a Network-on-Chip (NoC), retrieving at least a characteristic, selected from any or combination of a bandwidth requirement, latency requirement, protocol requirement and transactions, associated with the application from the profile information, generating at least one application traffic graph having mapping information based on the characteristic retrieved, and mapping the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the system is further configured to determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

An aspect of the present application relates to a non-transitory computer readable storage medium storing instructions for executing a process. The instructions include the steps of receiving an profile information associated with an application, retrieving at least a characteristic, selected from any or combination of a bandwidth requirement, latency requirement, protocol requirement and transactions, associated with the application from the profile information, generating at least one application traffic graph having mapping information based on the characteristic retrieved, and mapping the application traffic graph generated with into the FPGA using the hardened NoC.

The present application provides devices having a programmable fabric and a communication network integrated with the programmable fabric for high-speed data passing.

According to an example implementation, an FPGA incorporates one or more programmable NoCs or NoC components integrated within the FPGA fabric. In one example implementation, the NoC is used as system-level interconnect to connect computer and communication modules to one another and integrate large systems on the FPGA. The FPGA design flow is altered to target the NoC components either manually through designer intervention, or automatically. The computation and communication modules may be either constructed out of the FPGA's logic blocks block Random Access Memory (RAM) modules, multipliers, processor cores, input/output (I/O) controllers, I/O ports or any other computation or communication modules that can be found on FPGAs or heterogeneous devices based thereon.

The NoC or NoCs added to the FPGA involve routers and links, and optionally fabric ports. Routers refer to any circuitry that switches and optionally buffers data from one port to another. NoC routers may involve, but are not limited to, any of the following: crossbars, buffered crossbars, circuit-switched routers or packet-switched routers. Links are the connections between routers. In one example implementation NoC links are constructed out of the conventional FPGA interconnect which can involve different-length wire segments and multiplexers. In another example implementation, NoC links can involve dedicated metal wiring between two router ports. Both example implementations of the NoC links may include buffers or pipeline registers. The fabric port connects the NoC to the FPGA fabric and thus performs two key bridging functions. The first function of the fabric port is width adaptation between the computation or communication module and the NoC. In one example implementation, this is implemented as a multiplexer, a demultiplexer and a counter to perform time-domain multiplexing (TDM) and demultiplexing. The second function is clock-domain crossing; in one example implementation this is implemented as an asynchronous first-in first-out (FIFO) queue. Although the NoC targets digital electronic systems, all or parts of the presented NoC can be replaced using an optical network on chip. The NoC can also be implemented on a separate die in a 3D die stack.

Changes to the FPGA design flow to target NoCs may be divided into two categories; logical design and physical design. The logical design step concerns the functional design of the implemented system. In the logical design step all or part of the designed system is made latency-insensitive by adding wrappers to the modules. The logical design step also includes generating the required interfaces to connect modules to a NoC and programming the NoC for use. Programming the NoC includes, but is not limited to the following: configuring the routers, assigning priorities to data classes, assigning virtual channels to data classes and specifying the routes taken through the NoC. The physical design flow then implements the output of the logical design step on physical circuitry. It includes mapping computation and communication modules to NoC routers, and floor planning the mentioned modules onto the FPGA device. Together, these architecture and design flow changes due to the addition of NoCs to FPGAs will raise the level of abstraction of system-level communication, making design integration of large systems simpler and more automated and making system-level interconnect more efficient.

In an example implementation, a field-programmable gate array (FPGA) is an integrated circuit designed to be configured by a customer or a designer after manufacturing—hence "field-programmable". The FPGA configuration is generally specified using a hardware description language (HDL), similar to that used for an application-specific integrated circuit (ASIC). (Circuit diagrams were previously used to specify the configuration, as they were for ASICs, but this is increasingly rare.)

FPGAs contain an array of programmable logic blocks, and a hierarchy of reconfigurable interconnects that allow the blocks to be "wired together", like many logic gates that can be inter-wired in different configurations. Logic blocks can be configured to perform complex combinational functions, or logic gates such as AND, XOR, and so on. In most FPGAs, logic blocks also include memory elements, which may be simple flip-flops or more complete blocks of memory.

Figures 4A, 4B:
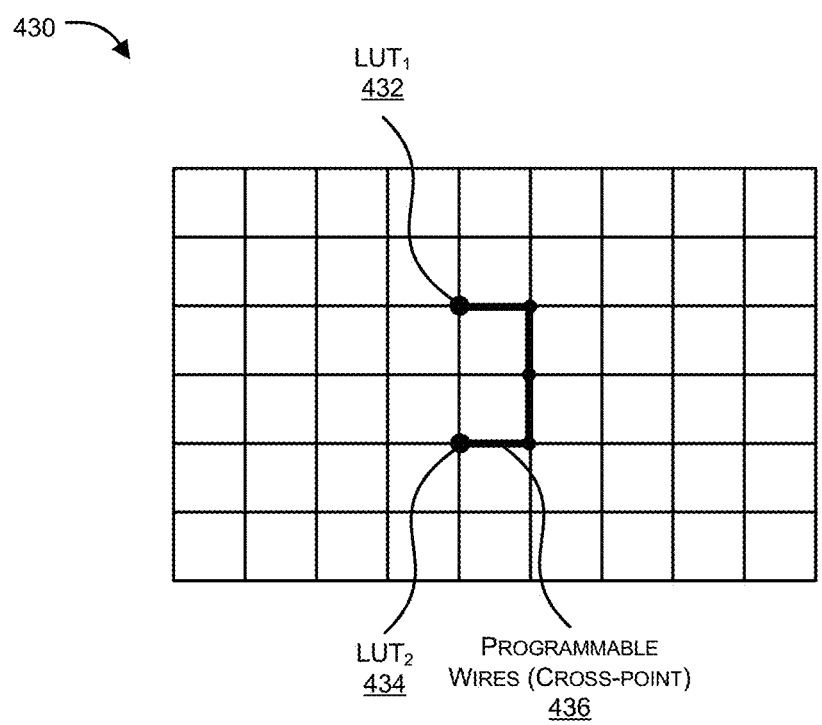
FIG. 4A illustrates a 1 Bit adder in FPGA.
FIG. 4B illustrates an FPGA comprising lookup tables (LUTs) and programmable wires.

FPGA includes a Lookup table (LUT) having bunch of inputs and bunch of outputs, wherein both inputs and outputs are programmable. Basically, one can configure input and output to achieve a specific/desired functioning. For example, if 1 Bit adder logic is to be implemented then there are four different logics i.e., (0, 0), (0, 1), (1, 0), (1, 1) and four different outputs. FIG. 4A 400 illustrates a 1 Bit adder in FPGA.

In an example implementation, the One-bit Full-Adder (FA) is used widely in systems with operations such as counter, addition, subtraction, multiplication and division etc. It is the basic core component of Arithmetic-Logic-Unit (ALU). Thus, the innovation and acceleration of FA means that the speed of the Central-Processor-Unit (CPU) and the speed of the whole system in general are accelerated. FA is a basic cell in the CPU and is so fundamental that changes to it are difficult to make. However, this cannot prevent researchers to try to increase the speed for FA.

In order to create one bit FA in the traditional methods, two's component gate must be used. This makes the circuit more complex, and when there is a subtraction of n bits, there should be an addition of n XOR gates. The FPGA device is becoming increasing popular, and the acceleration of the multiplexer and improvement in FPGA allow the configuration of the Look Up Table (LUT) in FPGA that functions as a memory or a logic functions. This especially allows the formation of many small LUT's inside a big LUT. New designs have the aim to increase the speed of FA based on LUT and Multiplexer.

Thus, FPGA works at the logic and tries to program the logic in the LUT by just exhaustively listing all the possible inputs and all the possible outputs. However, in a real system, there are many complex and many functionalities that need to be performed. Thus, multiple LUTs need to be internally connected to able to achieve multiple functions. However, to provide these connections in functionalities (programmable connections) there is a requirement of programmable set of wires.

For example, at FPGA there can be many LUTs (e.g., hundreds of millions) and can also involve plurality of wires, grids of wires and cross-points of wires that needs to be programmed and connected to work in sync with each other. Thus, there are needs for connecting multiple small logics together via, LUTs. Thus, the present invention provides a mechanism which enables to connect these FPGA's by way programming. FIG. 4B 430 illustrates an FPGA comprising lookup tables (LUTs) and programmable wires.

In an example implementation, as shown, $LUT_1$ 432 and $LUT_2$ 434 can be connected using programmable wires (cross-points) 436 to achieve connection to work in sync with each other.

Figure 4C:
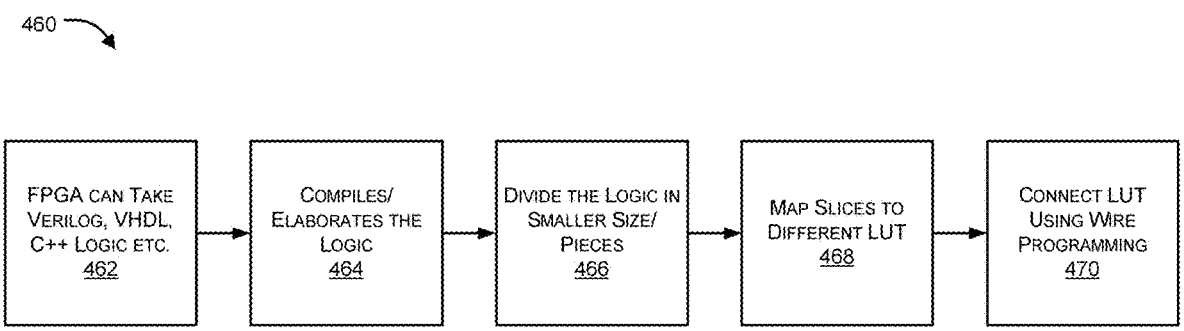
FIG. 4C illustrates a flow diagram for connecting LUTs using programmable wires as shown in FIG. 4B.

FIG. 4C 460 illustrates a flow diagram for connecting LUTs using programmable wires as shown in FIG. 4B. In order to connect plurality of LUTs using programmable wires, the present application at step 462, enables FPGA to receive Verilog, VHDL, C++ etc logics as inputs. At step 464, the FPGA compiles/elaborates the logic. At step 466, the FPGA divides the logic in smaller size/pieces. At step 468, the FPGA map slices to different LUTs. At step 470, the different LUTs are connected using wire programming.

However, while connecting the LUTs and programmable wires, there is a need to determine how many size/pieces of the logic are to be made, as well as how many connections are needed. If the size/pieces are too large then the LUT mapping may not be possible. One of the biggest obstacles is that LUTs may be upgraded/programmed with high frequencies. However, the wires are normally not upgraded/programmed with high frequencies.

Thus, the LUT and wires implement soft logic since it is programmable and are provided with less transparency and low frequency.

Example implementations described herein facilitate communication, which is required in FPGA, by packetizing the communication and can be transported over a hardened network voucher that is present in FPGA along with the soft logic. The example implementations facilitate the achievement of hardened logic (non-re-programmable) based on the soft logic. Such implementations can achieve a benefit that it has much high frequency which is achieved by low latency and higher bandwidth for the same number of wires.

FPGAs are embedded/incorporated with NoCs wherein the NoCs give an ability to transfer packets from one point to other point.

Also, once the Hardened NoC is built over the FPGA there is a need for mapping the traffic incoming and outgoing to a particular layer or merchant channel of within layer routing their needs a flexibility to choose route for the traffic (since there are multiple routes present). The flow can have different requirements in terms of bandwidth or burstiness etc. Hardened NoC can have layer flexibility, VC flexibility, and route flexibility. Application Mapping indicates how these layers, VCs and routes used for a particular application efficiently and meeting all the requirements and constraints of the system.

Figure 5:
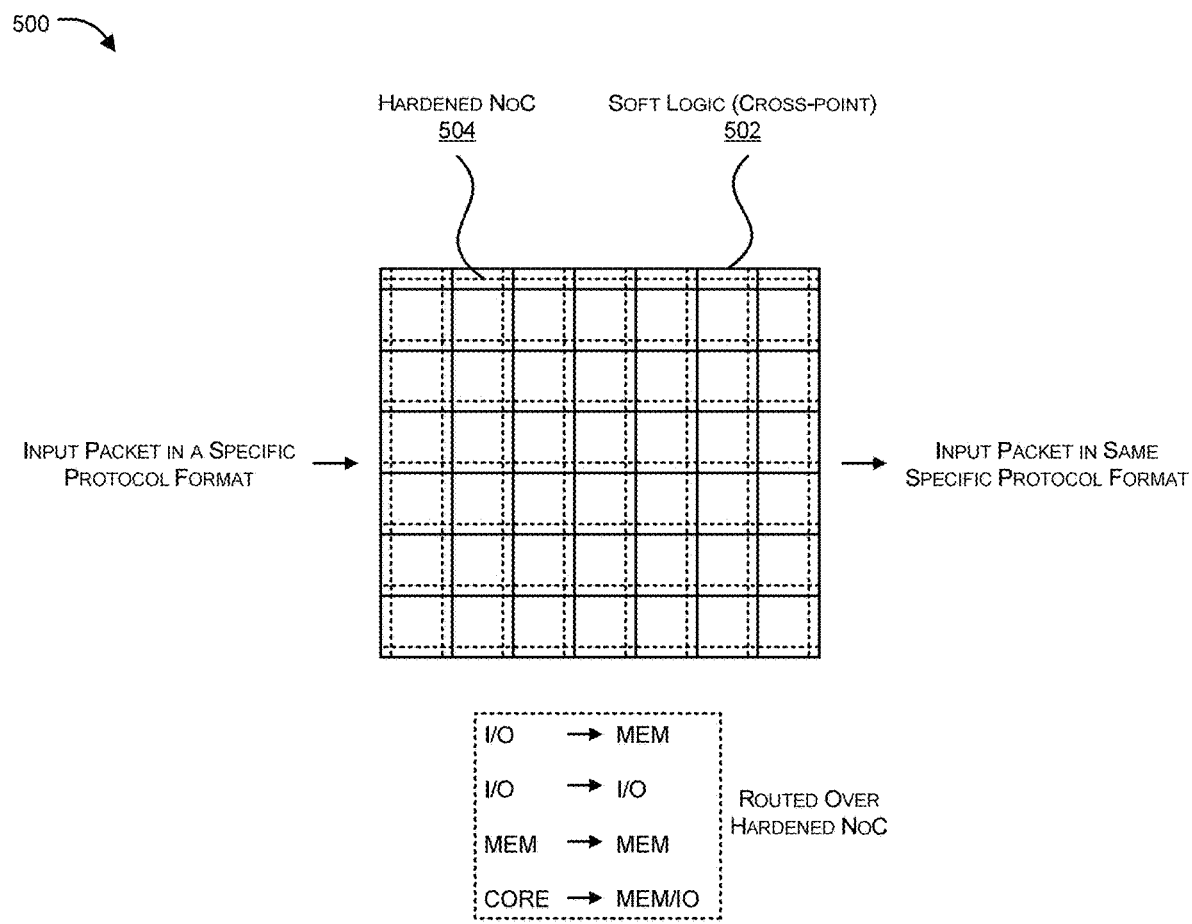
FIG. 5 illustrates a Field-Programmable Gate-Array (FPGA) system having soft logic and hardened logic.

Referring now to FIG. 5 a Field-Programmable Gate-Array (FPGA) 500 system having soft logic and hardened logic is illustrated. As shown, a soft logic can be implemented using programmable wires (cross-point) 502 and a hardened logic can be implemented using hardened NoC 504. The input packet entering in a FPGA 500 recited as "input packet in a specific protocol format" can be routed either through the programmable wires (cross-point) 502 or through the hardened NoC 504 to generate an output in the form of packet recited as "input packet in same specific protocol format".

In an example implementation, the inputs can be received by from Ethernet interface, Peripheral Component Interconnect (PCI) interface, Serializer/Deserializer (SerDes) interface, and the like.

In an example implementation, the input received can be in a particular specific protocol format having source and destination information which can directly routed to the destination without any alteration in the particular specific protocol format using a hardened network topology of the NoC. In another example implementation, the input received can be a particular specific protocol format having source but no destination information, cannot be directly routed to the destination but through using soft logic (cross-connection) and needs to be analyzed and then without any alteration in the particular specific protocol format routed to its destination.

In an example implementation, the packets coming in FPGA and going out are in the form of messages so they are suitable candidate over the hard NoC. The packets inside FPGA core assessing the memory can also be routed over the NoC.

In an example implementation, the present application allows the system to decide which packets are to be sent to NoC and which needs to be routed through FPGA. The packets which are in the form of messages and which has fixed source destination or rout to be followed can be routed through the NoC. More specifically, the messages which have specific details and destination are far away from each other passes through the NoC.

In an example implementation, in NoC there are bridges along with other sub-components. The bridges are used for receiving packets and convert the packet into NoC protocol format. Those bridges also have some cost for example in terms of area.

In an example implementation, a cost of a NoC is compared with the cost of a soft logic and if it is much greater than that of soft logic the NoC are not much beneficial.

In an example implementation, bridges in the NoC are provided to support certain protocols. The bridges included in the NoC can have 4 exemplary design choices. First exemplary design choice is a superset bridge that can support all the protocols however such bridge is excessively large and not cost effective. Second exemplary design choice is a bridge which can be built based on the requirements/compatibility. The soft logic in this type is aware about the placement of the bridges to satisfy the requirements of sufficiency of the bridges for communications. Third exemplary design choice is to not hardened at all but to have bridges that includes only soft logic. However, even if NoC is operating at higher frequency, the bridges may run at lower frequency. Fourth exemplary design choice for bridges is to divide bridges in protocol part and packet switching part so packet switching can be hardened and protocol part can be soft switching which may not give you ideal design but can provide a descent achievable performance.

In an example implementation, the topology for NoC depends on plurality of factors. Few of the exemplary factors can include but are not limited to types of applications that are being performed using the FPGA. For example, applications functionality can be examined to decide topology based on data/traffic flow for applications, message sizes, functions of the applications, distance of the applications etc.

Figure 6:
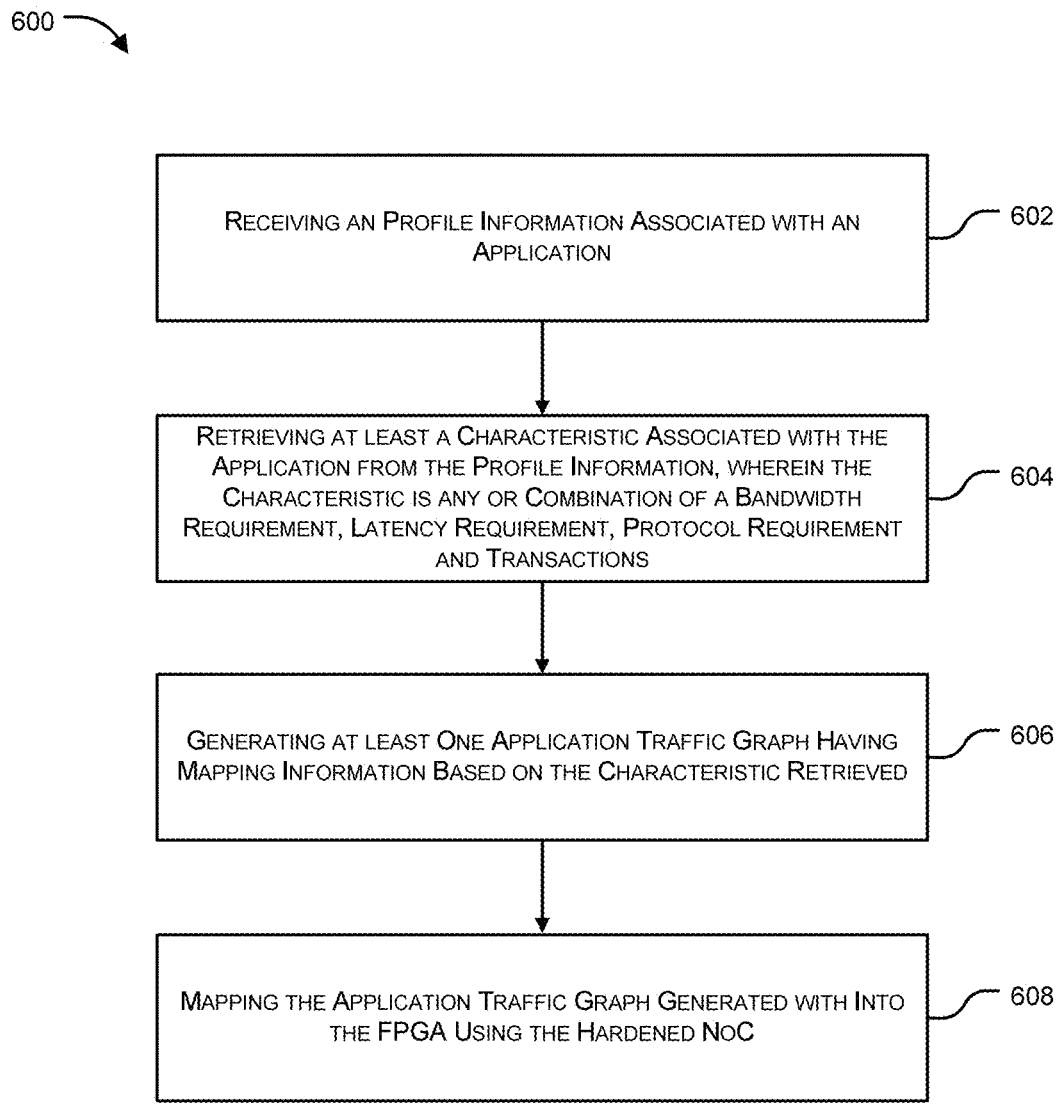
FIG. 6 illustrates exemplary flow diagram for the Field-Programmable Gate-Array (FPGA) system.

FIG. 6 600 illustrates an example flow diagram for the Field-Programmable Gate-Array (FPGA) system. The method at step 602 receives profile information associated with an application by a Network-on-Chip (NoC), at step 604 retrieves at least a characteristic, selected from any one or any combination of a bandwidth requirement, latency requirement, protocol requirement and transactions, associated with the application from the profile information, at step 606 generates at least one application traffic graph having mapping information based on the characteristic retrieved, and at step 608 maps the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the method can further determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

Figure 7:
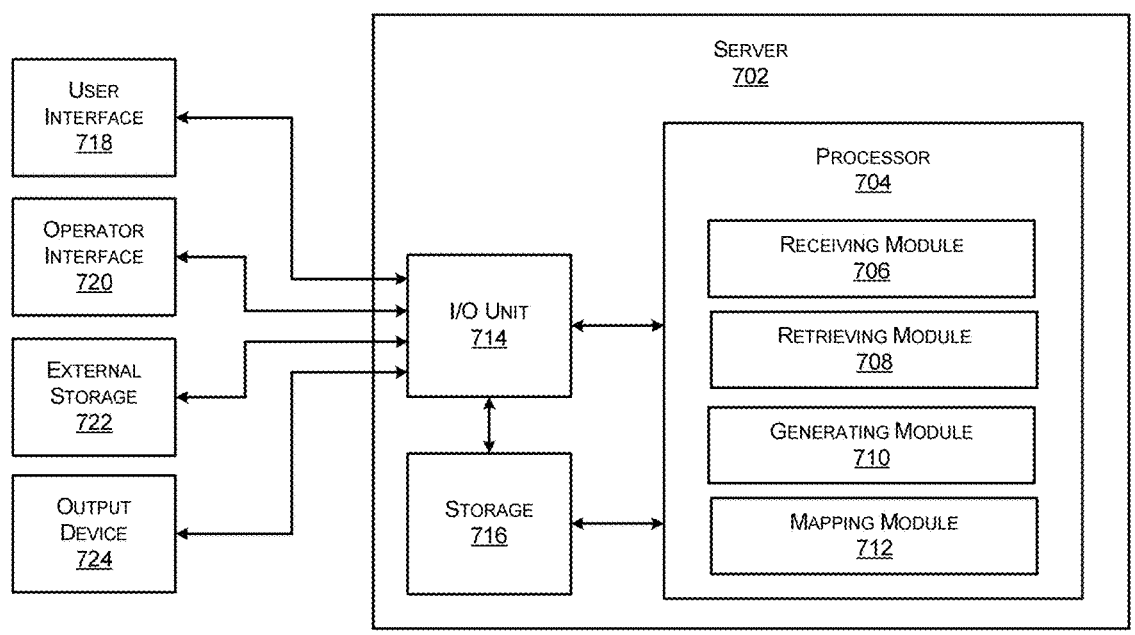
FIG. 7 illustrates an example computer system on which example implementations may be implemented.

FIG. 7 illustrates an example computer system on which example implementations may be implemented. This example system is merely illustrative, and other modules or functional partitioning may therefore be substituted as would be understood by those skilled in the art. Further, this system may be modified by adding, deleting, or modifying modules and operations without departing from the scope of the inventive concept.

In an aspect, computer system 700 includes a server 702 that may involve an I/O unit 714, storage 716, and a processor 704 operable to execute one or more units as known to one skilled in the art. The term "computer-readable medium" as used herein refers to any medium that participates in providing instructions to processor 704 for execution, which may come in the form of computer-readable storage mediums, such as, but not limited to optical disks, magnetic disks, read-only memories, random access memories, solid state devices and drives, or any other types of tangible media suitable for storing electronic information, or computer-readable signal mediums, which can include transitory media such as carrier waves. The I/O unit processes input from user interfaces 718 and operator interfaces 720 which may utilize input devices such as a keyboard, mouse, touch device, or verbal command.

The server 702 may also be connected to an external storage 722, which can contain removable storage such as a portable hard drive, optical media (CD or DVD), disk media or any other medium from which a computer can read executable code. The server may also be connected an output device 724, such as a display to output data and other information to a user, as well as request additional information from a user. The connections from the server 702 to the user interface 718, the operator interface 720, the external storage 722, and the output device 724 may via wireless protocols, such as the 802.11 standards, Bluetooth® or cellular protocols, or via physical transmission media, such as cables or fiber optics. The output device 724 may therefore further act as an input device for interacting with a user.

The processor 704 may execute one or more modules including includes a receiving module 706 receive an profile information associated with an application, a retrieving module 708 to retrieve at least a characteristic, selected form any of combination of any or combination of a bandwidth requirement, latency requirement, protocol requirement and transactions, associated with the application from the profile information, a generating module 710 to generate at least one application traffic graph having mapping information based on the characteristic retrieved, and a mapping module 712 to map the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the system is further configured to determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

It may be appreciated that, the nodes of the application graph are floating since the positions of the nodes are not specified in FPGA all the time. For examples, cores are not frozen.

It may also be appreciated that, there is also a requirement of application load balancing in automated manner. Thus, the present application enables to decide mapping, however once mapping is decided, it is required to program those mapping in the IOs of the FPGA. Therefore there is requirement of hardware built in FPGA which is programmable so that the mapping can be performed when FPGA is deployed.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the example implementations disclosed herein. Various aspects and/or components of the described example implementations may be used singly or in any combination. It is intended that the specification and examples be considered as examples, with a true scope and spirit of the application being indicated by the following claims.

What is claimed is:

1. A Field-Programmable Gate-Array (FPGA) system, comprising:
   an FPGA comprising one or more lookup tables (LUTs) and wires; and
   a Network-on-Chip (NoC), coupled to the FPGA, comprising a hardened network topology configured to provide connectivity at a higher frequency than the FPGA, wherein the NoC is configured to:
   receive profile information associated with an application;
   retrieve at least a characteristic associated with the application from the profile information, wherein the characteristic is one or a combination of a bandwidth requirement, latency requirement, protocol requirement and transactions;
   generate at least one application traffic graph having mapping information based on the retrieved characteristic; and
   map the generated application traffic graph into the FPGA using the hardened NoC, wherein the NoC comprises a mechanism to be configured by software to modify one or more functions associated with the NoC, wherein the one or more functions of the NoC are associated with any of combination quality of service (QoS), priority, virtual channel (VC) allocation, rate limits, buffer sizing, layer/physical channel assignment.

2. The FPGA system of claim 1, wherein while the hardened NoC is deployed in the FPGA, the hardened NoC is reconfigured in accordance with the application traffic graph.

3. The FPGA system of claim 2, wherein the hardened NoC is reconfigured through receiving at the FPGA system, mapping information for one or more characteristic associated with the application and transmitting the mapping information to the hardened NoC.

4. The FPGA system of claim 1, wherein the application traffic graph comprises a plurality of nodes indicative of representations of traffic associated with the application, wherein the plurality of nodes interact based on bandwidth requirements, latency requirements, protocol requirements and transactions retrieved.

5. The FPGA system of claim 1, wherein the mapping information comprises transaction assignments of one or more traffic profiles to each NoC layer in the hardened NoC and route assignments for each NoC layer in the hardened NoC.

6. The FPGA system of claim 1, wherein the hardened NoC is configured to:
   determine all allowed subsets of the plurality of application traffic profiles; and
   determine a NoC configuration that is configured to support the determined all allowed subsets, wherein the NoC configuration further comprises:
   one or more physical channels;
   one or more virtual channels; and one or more NoC layers;
   wherein the hardened NoC is configured to utilize quality of Service (QoS) parameters for each of the one or more physical channels and the one or more virtual channels; and weights for each of the one or more physical channels and the one or more virtual channels.

7. The FPGA system of claim 1, wherein the application traffic graph is received from a user.

8. The FPGA system of claim 1, wherein the application traffic graph is generated based on the traffic profile fed to the FPGA system.

9. The FPGA system of claim 1, wherein the application traffic graph is generated based on one or more meta-data associated with one or more packet received by the FPGA system.

10. The FPGA system of claim 1 further configured to determine at least a part of application graph to be mapped with the hardened NoC and at least a part of application graph to be mapped with the soft logic.

11. The FPGA system of claim 1, wherein the NoC comprises virtual channel (VC) and physical layers allocated based at least on quality of service (QoS), latency, bandwidth requirements, number of inputs/outputs (I/Os), memories, soft intellectual properties (IPs) that are connected to the NoC.

12. The FPGA system of claim 1, wherein the NoC comprises one or more bridges configured to support multiple protocols.

13. The FPGA system of claim 1, wherein the NoC comprises at least a programmable decoding element to determine any or combination of a route, a layer and destination information from one or more messages transported over the NoC.

14. A Field-Programmable Gate-Array (FPGA) system, comprising:
- an FPGA comprising one or more lookup tables (LUTs) and wires; and
- a Network-on-Chip (NoC), coupled to the FPGA, comprising a hardened network topology configured to provide connectivity at a higher frequency than the FPGA, wherein the NoC is configured to:
  - receive profile information associated with an application;
  - retrieve at least a characteristic associated with the application from the profile information, wherein the characteristic is one or a combination of a bandwidth requirement, latency requirement, protocol requirement and transactions;
  - generate at least one application traffic graph having mapping information based on the retrieved characteristic; and
  - map the generated application traffic graph into the FPGA using the hardened NoC,
  - wherein the hardened NoC is configured to:
    - determine all allowed subsets of the plurality of application traffic profiles; and
    - determine a NoC configuration that is configured to support the determined all allowed subsets.

15. The FPGA system of claim 14, wherein while the hardened NoC is deployed in the FPGA, the hardened NoC is reconfigured in accordance with the application traffic graph.

16. The FPGA system of claim 15, wherein the hardened NoC is reconfigured through receiving at the FPGA system, mapping information for one or more characteristic associated with the application and transmitting the mapping information to the hardened NoC.

17. The FPGA system of claim 14, wherein the application traffic graph comprises a plurality of nodes indicative of representations of traffic associated with the application, wherein the plurality of nodes interact based on bandwidth requirements, latency requirements, protocol requirements and transactions retrieved.

18. The FPGA system of claim 14, wherein the mapping information comprises transaction assignments of one or more traffic profiles to each NoC layer in the hardened NoC and route assignments for each NoC layer in the hardened NoC.

19. The FPGA system of claim 14, wherein the NoC comprises a mechanism to be configured by software to modify one or more functions associated with the NoC.

20. The FPGA system of claim 19, wherein the one or more functions of the NoC are associated with any of combination quality of service (QoS), priority, virtual channel (VC) allocation, rate limits, buffer sizing, layer/physical channel assignment.

* * * * *